(12) United States Patent
Kim et al.

(10) Patent No.: US 11,093,065 B2
(45) Date of Patent: Aug. 17, 2021

(54) DISPLAY DEVICE

(71) Applicant: Samsung Display Co., Ltd., Yongin-si (KR)

(72) Inventors: Mi Young Kim, Hwaseong-si (KR); Sang Hyun Jun, Suwon-si (KR); Kwang Hyeok Kim, Cheonan-si (KR); So Yeon Park, Yongin-si (KR); Yong Hwan Park, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/907,048

(22) Filed: Jun. 19, 2020

(65) Prior Publication Data

US 2021/0191549 A1 Jun. 24, 2021

(30) Foreign Application Priority Data

Dec. 20, 2019 (KR) .................. 10-2019-0171738

(51) Int. Cl.
*G06F 3/041* (2006.01)
*H01L 27/32* (2006.01)
*H01L 51/52* (2006.01)
*G06F 3/044* (2006.01)

(52) U.S. Cl.
CPC .......... *G06F 3/0412* (2013.01); *G06F 3/0445* (2019.05); *H01L 27/323* (2013.01); *H01L 27/3276* (2013.01); *H01L 51/5237* (2013.01); *G06F 2203/04107* (2013.01)

(58) Field of Classification Search
CPC .......... G06F 3/0412; G06F 3/041–047; G06F 3/0443; G06F 3/041662; G06F 2203/0338; G06F 2203/04107; G06F 2203/04112; G06F 3/0448; G06F 30/394; H01L 23/5225
See application file for complete search history.

(56) References Cited

U.S. PATENT DOCUMENTS

2010/0220071 A1   9/2010  Nishihara et al.
2011/0316803 A1*  12/2011 Kim ................... G06F 3/0446
                                                345/173
2017/0090652 A1   3/2017  Sato et al.
(Continued)

FOREIGN PATENT DOCUMENTS

EP    2267791 A2   12/2010
EP    3232302 A1   10/2017
(Continued)

*Primary Examiner* — Sanjiv D. Patel
(74) *Attorney, Agent, or Firm* — Lewis Roca Rothgerber Christie LLP

(57) ABSTRACT

A display device, includes: a substrate including an active area and a non-active area around the active area and including a pad area in which a plurality of touch pads are arranged; a plurality of sensing electrodes in the active area of the substrate; a plurality of sensing signal lines connected to each of the sensing electrodes; a multiplexer connected to the plurality of sensing signal lines; a pad multiplexer connection line connecting the multiplexer and the touch pad; and a transverse electric field blocking pattern between the pad multiplexer connection line and the substrate, wherein the transverse electric field blocking pattern covers the pad multiplexer connection line.

20 Claims, 21 Drawing Sheets

(56) References Cited

U.S. PATENT DOCUMENTS

| | | | |
|---|---|---|---|
| 2017/0228084 A1* | 8/2017 | Kim | G06F 3/041662 |
| 2018/0203555 A1 | 7/2018 | Miyamoto | |
| 2018/0261147 A1 | 9/2018 | Lin et al. | |
| 2018/0284926 A1 | 10/2018 | Kim et al. | |
| 2019/0067333 A1* | 2/2019 | Yamamoto | G06F 3/04164 |

FOREIGN PATENT DOCUMENTS

| | | |
|---|---|---|
| KR | 10-2012-0116651 A | 10/2012 |
| KR | 10-2019-0034942 A | 4/2019 |

\* cited by examiner

DISPLAY DEVICE

CROSS-REFERENCE TO RELATED APPLICATION

The present application claims priority to and the benefit of Korean Patent Application No. 10-2019-0171738 filed on Dec. 20, 2019 in the Korean Intellectual Property Office, the disclosure of which is incorporated by reference herein in its entirety.

BACKGROUND

1. Field

Aspects of some example embodiments of the present invention relate to a display device.

2. Description of the Related Art

A display device for displaying an image may be utilized for or incorporated in various electronic appliances for displaying images to users. Such electronic appliance may include, for example, smart phones, tablet PCs, digital cameras, notebook computers, navigators, and televisions. A display device may include a display panel for generating and displaying images, as well as various input devices.

In various electronic devices, for example, in the field of smart phones and tablet PCs, a touch panel for recognizing a touch input may be utilized with a display device. The touch panel determines (recognizes) whether or not a user's touch input is provided, and calculates the corresponding position as touch input coordinates.

The touch panel may include electrode units. In this case, as the area of the electrode units increases, parasitic capacitance formed with a conductive layer of the display panel may increase.

The above information disclosed in this Background section is only for understanding of the background of the inventive concepts, and, therefore, it may contain information that does not constitute prior art.

SUMMARY

Aspects of some example embodiments of the present invention include a display device having relatively improved interference with a driving circuit adjacent to a connection line connecting an electrode unit and a touch pad of a touch sensor.

Additional characteristics of some example embodiments of the present invention will be set forth in the description which follows, and in part will be apparent from the description, or may be learned by practice of example embodiments of the inventive concepts.

According to some example embodiments according to the present disclosure, a display device includes a substrate including an active area and a non-active area around the active area and including a pad area in which a plurality of touch pads are arranged; a plurality of sensing electrodes arranged in the active area of the substrate; a plurality of sensing signal lines connected to each of the sensing electrodes; a multiplexer connected to the plurality of sensing signal lines; a pad multiplexer connection line connecting the multiplexer and the touch pad; and a transverse electric field blocking pattern between the pad multiplexer connection line and the substrate, wherein the transverse electric field blocking pattern covers the pad multiplexer connection line.

According to some example embodiments, each of the sensing signal lines is connected to each of the sensing electrodes in one to one correspondence.

According to some example embodiments, the display device further comprises a driving circuit adjacent to the pad multiplexer connection line, wherein the transverse electric field blocking pattern is configured to block a transverse electric field between the driving circuit and the pad multiplexer connection line.

According to some example embodiments, the display device further comprises a cathode electrode between the pad multiplexer connection line and the sensing electrode, wherein the cathode electrode covers the pad multiplexer connection line and the driving circuit.

According to some example embodiments, the driving circuit includes a light emission control driving circuit or a scan driving circuit.

According to some example embodiments, the driving circuit includes a thin film transistor, and the pad multiplexer connection line extends in parallel with input signal lines connected to a gate electrode of the thin film transistor of the driving circuit.

According to some example embodiments, the display device further comprises a ground line between the pad multiplexer connection line and the input signal line.

According to some example embodiments, the transverse electric field blocking pattern is electrically connected to the ground line.

According to some example embodiments, the multiplexer includes a thin film transistor, and the thin film transistor of the multiplexer includes a drain electrode connected to the sensing signal line, a source electrode connected to the pad multiplexer connection line, and a gate electrode under the drain electrode and the source electrode.

According to some example embodiments, the sensing signal line is electrically connected to a source connection electrode under the sensing signal line, and the source connection electrode is electrically connected to the drain electrode.

According to some example embodiments, the source connection electrode is electrically connected to a gate connection electrode under the source connection electrode, and the gate connection electrode is electrically connected to the drain electrode.

According to some example embodiments, the gate electrode is electrically connected to a selection signal line of the multiplexer.

According to some example embodiments, the display device further comprises a driving substrate attached onto the pad area, wherein the driving substrate is configured to apply an input signal to the sensing electrode and apply an output signal outputted from the sensing electrode.

According to some example embodiments, the display device further comprises a transverse electric field blocking pattern pad electrically connected to the transverse electric field blocking pattern in the pad area, wherein a voltage is applied to the transverse electric field blocking pattern through the transverse electric field blocking pattern pad.

According to some example embodiments, the voltage applied to the transverse electric field blocking pattern is equal to a voltage of the input signal and/or a voltage of the output signal.

According to some example embodiments, the cathode electrode overlaps the transverse electric field blocking pattern and is electrically connected to the transverse electric field blocking pattern.

According to some example embodiments according to the present disclosure, a display device includes a substrate including an active area and a non-active area around the active area and including a pad area in which a plurality of touch pads are arranged; a plurality of light emitting elements arranged in the active area of the substrate; an encapsulation layer on the plurality of light emitting elements and over the active area and the non-active area; a touch sensor on the encapsulation layer, in which the touch sensor includes a plurality of sensing electrodes arranged on the active area of the encapsulation layer and a plurality of sensing signal lines connected to each of the sensing electrodes; a plurality of sensing signal lines connected to each of the sensing electrodes; a multiplexer connected to the plurality of sensing signal lines; a pad multiplexer connection line connecting the multiplexer and the touch pad; and a transverse electric field blocking pattern between the pad multiplexer connection line and the substrate, wherein the transverse electric field blocking pattern covers the pad multiplexer connection line.

According to some example embodiments, each of the sensing signal lines is connected to each of the sensing electrodes in one to one correspondence.

According to some example embodiments, the display device further comprises a driving circuit adjacent to the pad multiplexer connection line, wherein the transverse electric field blocking pattern is configured to block a transverse electric field between the driving circuit and the pad multiplexer connection line.

According to some example embodiments, the display device further comprises a cathode electrode between the pad multiplexer connection line and the sensing electrode, wherein the cathode electrode covers the pad multiplexer connection line and the driving circuit, and the driving circuit includes a light emission control driving circuit or a scan driving circuit.

However, aspects of example embodiments according to the present invention are not restricted to those set forth herein. The above and other aspects of the present invention will become more apparent to one of ordinary skill in the art to which the present invention pertains by referencing the detailed description of the present invention given below.

BRIEF DESCRIPTION OF THE DRAWINGS

The above and other aspects and features of embodiments according to the present invention will become more apparent by describing in more detail aspects of some example embodiments thereof with reference to the attached drawings, in which.

DETAILED DESCRIPTION

Figure 1:
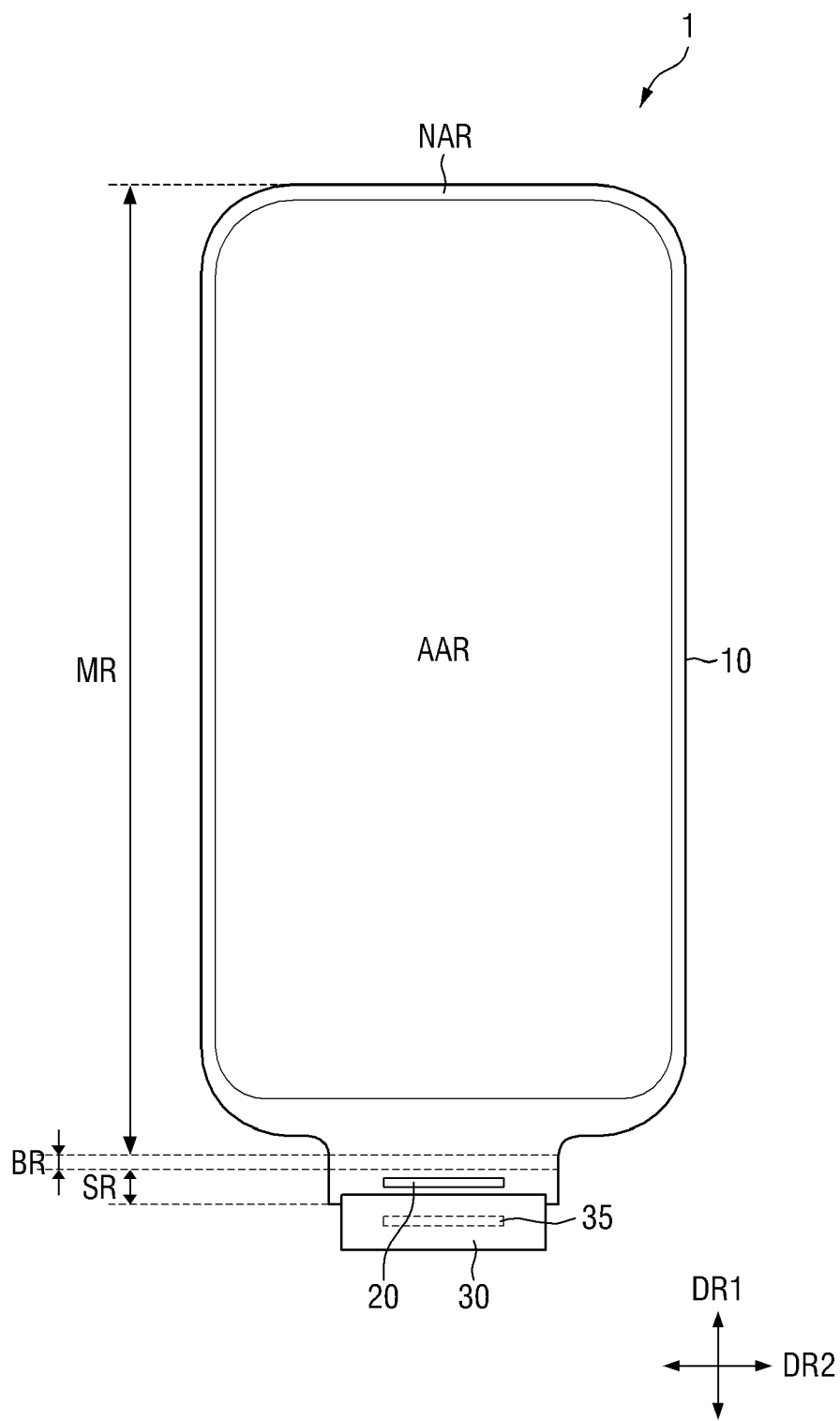
FIG. 1 is a plan layout view of a display device according to some example embodiments.

Specific structural and functional descriptions of aspects of some example embodiments of the invention disclosed herein are only for illustrative purposes of the embodiments of the invention. The invention may be embodied in many different forms without departing from the spirit and significant characteristics of the invention. Therefore, the embodiments of the invention are disclosed only for illustrative purposes and should not be construed as limiting the invention. That is, the invention is only defined by the scope of the claims.

It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The example term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The example terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Aspects of some example embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, aspects of some example embodiments of the invention will be described in more detail with reference to the attached drawings.

Figure 2:
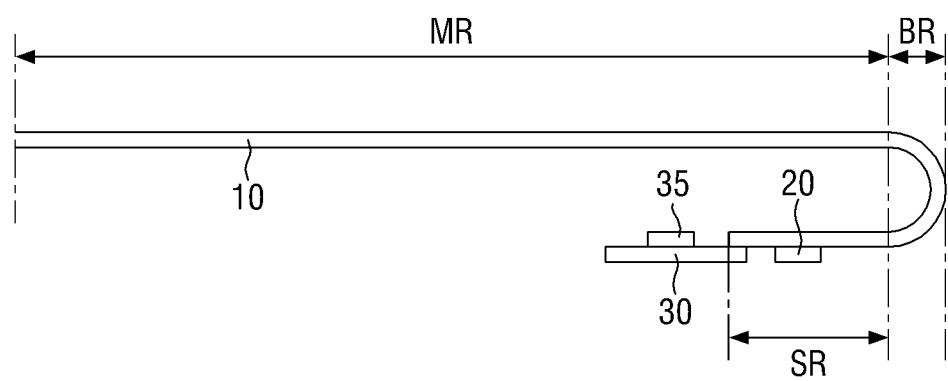
FIG. 2 is a schematic partial cross-sectional view of a display device according to some example embodiments.

FIG. 1 is a plan layout view of a display device according to some example embodiments, and FIG. 2 is a schematic partial cross-sectional view of a display device according to some example embodiments.

According to some example embodiments, a first direction DR1 and a second direction DR2 cross each other in different directions (e.g., in perpendicular directions). In the plan view of FIG. 1, for convenience of description, the first direction DR1 which is a vertical direction and the second direction DR2 which is a horizontal direction are defined. In the following description of some example embodiments, one side of the first direction DR1 refers to an upward direction in the plan view, the other side of the first direction DR1 refers to a downward direction in the plan view, one side of the second direction DR2 refers to a right direction in the plan view, and the other side of the second direction DR2 refers to a left direction in the plan view. However, the directions mentioned in the example embodiments should be understood to refer to relative directions, and the embodiments are not limited to the aforementioned directions.

Referring to FIGS. 1 and 2, a display device 1 may refer to any electronic device that provides a display screen. Examples of the display device 10 may include various products such as televisions, notebooks, monitors, billboards, and internets of things as well as portable electronic appliances such as mobile phones, smart phones, tablet personal computers (PCs), smart watches, watch phones, mobile communication terminals, electronic notebooks, electronic books, portable multimedia players (PMPs), navigators, and ultra mobile PCS (UMPs).

The display device 1 includes an active area AAR and a non-active area NAR. In the display device 1, when a portion displaying a screen (or an area displaying images) is defined as a display area, a portion not displaying a screen (or an area not displaying images) is defined as a non-display area, and an area where a touch input is detected is defined as a touch area, the display area and the touch area may be included in the active area AAR. The display area and the touch area may overlap each other. That is, the active area AAR may be an area where display is performed and touch input is also detected. The shape of the active area AAR may be a rectangle or a rectangle having rounded corners. For example, the shape of the active area AAR is a rectangle which has rounded corners and in which the first direction DR1 is longer than the second direction DR2. However, embodiments according to the present invention are not limited thereto, and the active area AAR may have various shapes such as a rectangle in which the second direction DR2 is longer than the first direction DR1, a square, other polygons, a circle, and an ellipse.

The non-active area NAR is located or arranged around the active area AAR. The non-active area NAR, for example, may be a bezel area. The non-active area NAR may surround all sides (four sides in the drawings) of the active area AAR. However, embodiments according to the present invention are not limited thereto. For example, the non-active area NAR may not be located around the upper side of the active area AAR or around the left and right sides of the active area AAR, and the AAR may extend to the edge of the display device 10 without including a bezel area.

Signal lines or driving circuits for applying signals to the active area AAR (display area or touch area) may be arranged in the non-active area NAR. The non-active area NAR may not include a display area. Moreover, the non-active area NAR may not include a touch area. According to some example embodiments, the non-active area NAR may include a part of the touch area, and a sensing member such as a pressure sensor may be located in the corresponding area. According to some example embodiments, the active area AAR may be exactly the same area as the display area where a screen is displayed, and the non-active area NAR may be the same area as the non-display area where a screen is not displayed.

The display device 1 includes a display panel 10 that provides a display screen. Examples of the display panel may include an organic light emitting display panel, a micro LED display panel, a nano LED display panel, a quantum dot light emitting display panel, a liquid crystal display panel, a plasma display panel, a field emission display panel, an electrophoretic display panel, and an electrowetting display panel. Hereinafter, a case where the organic light emitting display panel is applied is illustrated as an example of the display panel 10. However, embodiments according to the present invention are not limited thereto, and the same technical idea may be applied to other display panels.

The display panel 10 may include a plurality of pixels. The plurality of pixels may be arranged in a matrix direction or configuration. The shape of each pixel may be a rectangle or a square in a plan view, but embodiments according to the present disclosure are not limited thereto, and each pixel may have a rhombus shape in which each side is inclined with respect to the first direction DR1. Each pixel may include a light emitting area. Each light emitting area may have the same shape as the pixel, but may have a different shape from the pixel. For example, when the pixel has a rectangular shape, the light emitting area of the corresponding pixel may have various shapes such as a rectangle, a rhombus, a hexagon, an octagon, and a circle. Details of each pixel and each light emitting area will be described in more detail below.

The display device 1 may further include a touch member that detects a touch input. The touch member may be provided as a panel or a film separate from the display panel 10 and attached to the display panel 10, but may be provided in the form of a touch layer inside the display panel 10. According to some example embodiments, an example embodiment in which the touch member is provided inside the display panel to be included in the display panel 10 is illustrated, but embodiments according to the present invention are not limited thereto.

The display panel 10 may include a flexible substrate including a flexible polymer material such as polyimide. Accordingly, the display panel 10 may be bent, warped, folded, or rolled.

The display panel 10 may include a bending area BR in which the panel is bent. The display panel 10 may be divided into a main area MR located atone side of the bending area BR and a sub-area SR located at the other side of the bending area BR, based on the bending area BR.

The display area of the display panel 10 is located in the main area MR. According to some example embodiments, in the main area MR, edges around the display area, the entire bending area BR, and the entire sub-area SR may be non-display areas. However, embodiments according to the present invention are not limited thereto, and the bending area BR and/or the sub-area SR may include a display area.

The main area MR may generally have a shape similar to the planar appearance of the display device 1. The main area MR may be a flat area located in one plane. However, embodiments according to the present invention are not limited thereto, and at least one of the remaining edges other than the edge (side) connected to the bending area BR may be curved in the main area MR to form a curved surface or bend in the vertical direction. When at least one of the remaining edges other than the edge (side) connected to the bending area BR may be curved or bent in the main area MR, the display area may also be arranged at the corresponding edge. However, embodiments according to the present invention are not limited thereto, and the curved or bent edge may be a non-display area that does not display the screen, or the display area and the non-display area may be mixed in the corresponding portion.

The bending area BR is connected to one side of the main area MR in the first direction DR1. For example, the bending area BR may be connected through the lower short side of the main area MR. The width of the bending area BR may be smaller (or narrower) than the width (short width) of the main area MR. The connection portion of the main area MR and the bending area BR may have an L-shaped cutting shape.

In the bending area BR, the display panel 10 may be bent with curvature in a downward direction in the thickness direction, that is, in a direction opposite to a display surface. The bending area BR may have a constant radius of curvature, but embodiments according to the present disclosure are not limited thereto, and some example embodiments may have a different radius of curvature for each section. As the display panel 10 is bent in the bending area BR, the surface of the display panel 10 may be reversed. That is, one surface of the display panel 10 facing upward may be changed to face outward through the bending area BR and then face downward.

The sub-area SR extends from the bending area BR. The sub-area SR may extend in a direction parallel to the main area MR immediately after the bending is completed. The sub-area SR may overlap the main area MR in the thickness direction of the display panel 10. That is, according to some example embodiments, the display panel 10 may be bent at the bending area BR such that the sub-area SR is located behind or underneath the main area MR such that the sub-area SR overlaps with the main area MR in a direction normal to a plane of the main area MR. The width (width in the second direction DR2) of the sub-area SR may be equal to the width of the bending area BR, but embodiments according to the present invention are not limited thereto.

A driving chip 20 may be located in the sub-area SR. The driving chip 20 may include an integrated circuit for driving the display panel 10. The integrated circuit may include an integrated circuit for display.

A pad unit may be located at an end of the sub-area SR of the display panel 10. The pad unit may include a plurality of display signal line pads and a plurality of touch signal line pads. A driving substrate FPC may be connected to the pad unit provided at the end of the sub-area SR of the display panel 10. The driving substrate 30 may be a flexible printed circuit board or a film. The driving substrate 30 may include a substrate driving chip 35. The substrate driving chip 35 may include an integrated circuit for a touch unit. According to some example embodiments, the integrated circuit for display and the integrated circuit for a touch unit may be provided as separate chips. However, embodiments according to the present invention are not limited thereto, and the integrated circuit for display and the integrated circuit for a touch unit may be provided to be integrated into one chip.

Figure 3:
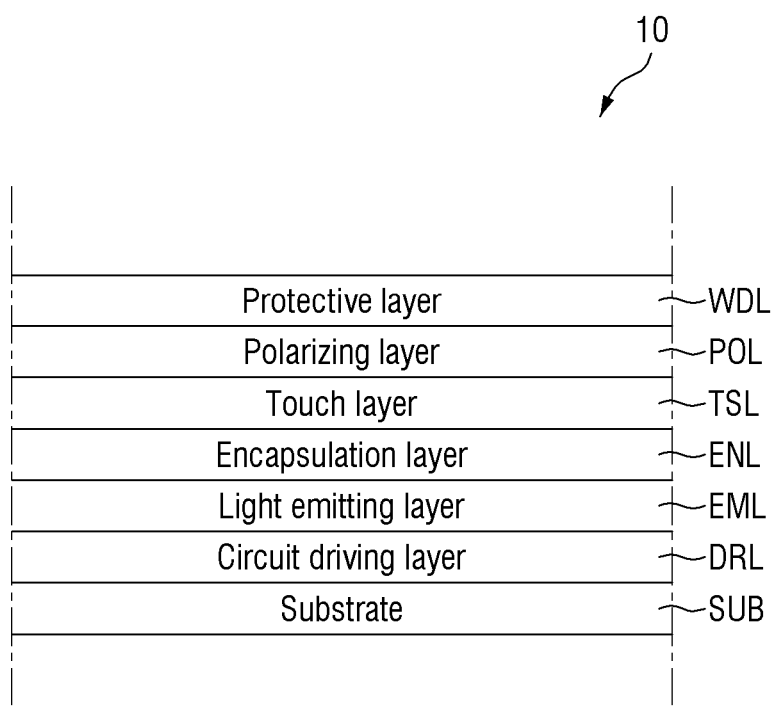
FIG. 3 is a schematic cross-sectional view illustrating an example laminate structure of a display panel according to some example embodiments.

FIG. 3 is a schematic cross-sectional view illustrating an example laminate structure of a display panel according to some example embodiments.

Referring to FIG. 3, the display panel 10 may include a circuit driving layer DRL located on a substrate SUB. The circuit driving layer DRL may include a circuit for driving alight emitting layer EML of a pixel. The circuit driving layer DRL may include a plurality of thin film transistors.

A light emitting layer EML may be located or formed on the circuit driving layer DRL. The light emitting layer EML may include an organic light emitting layer. The light emitting layer EML may emit light with various luminance according to or based on a driving signal transmitted from the circuit driving layer DRL.

An encapsulation layer ENL may be located or formed on the light emitting layer EML. The encapsulation layer ENL may include an inorganic film or a laminated film of an inorganic film and an organic film. As another example, a glass or an encapsulation film may be applied as the encapsulation layer ENL.

A touch layer TSL or a touch sensor may be located on the encapsulation layer ENL. The touch layer TSL is a layer that recognizes a touch input, and may function as a touch member. The touch layer TSL may include a plurality of sensing areas and a plurality of sensing electrodes.

A polarizing layer POL may be located on the touch layer TSL. The polarizing layer POL may serve to reduce external light reflection. The polarizing layer POL may be attached onto the touch layer TSL through an adhesive layer. According to some example embodiments, however, the polarizing layer POL may be omitted.

A protective layer WDL may be located or formed on the polarizing layer POL. The protective layer WDL may include, for example, a window member. The protective layer WDL may be attached onto the polarizing layer POL by an optically clear adhesive or the like.

Figure 4:
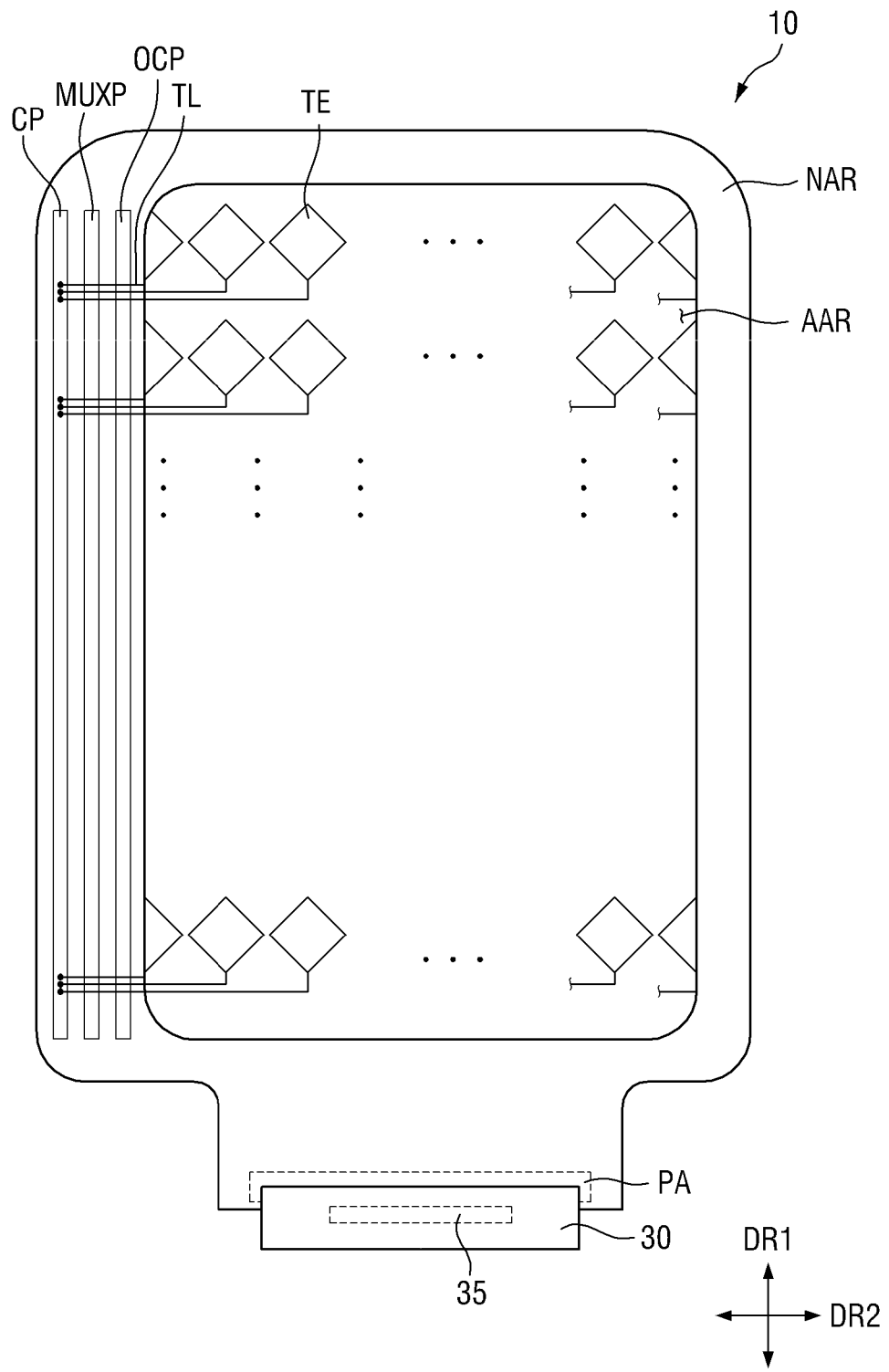
FIG. 4 is a schematic plan layout view of a display panel according to some example embodiments.
Figure 5:
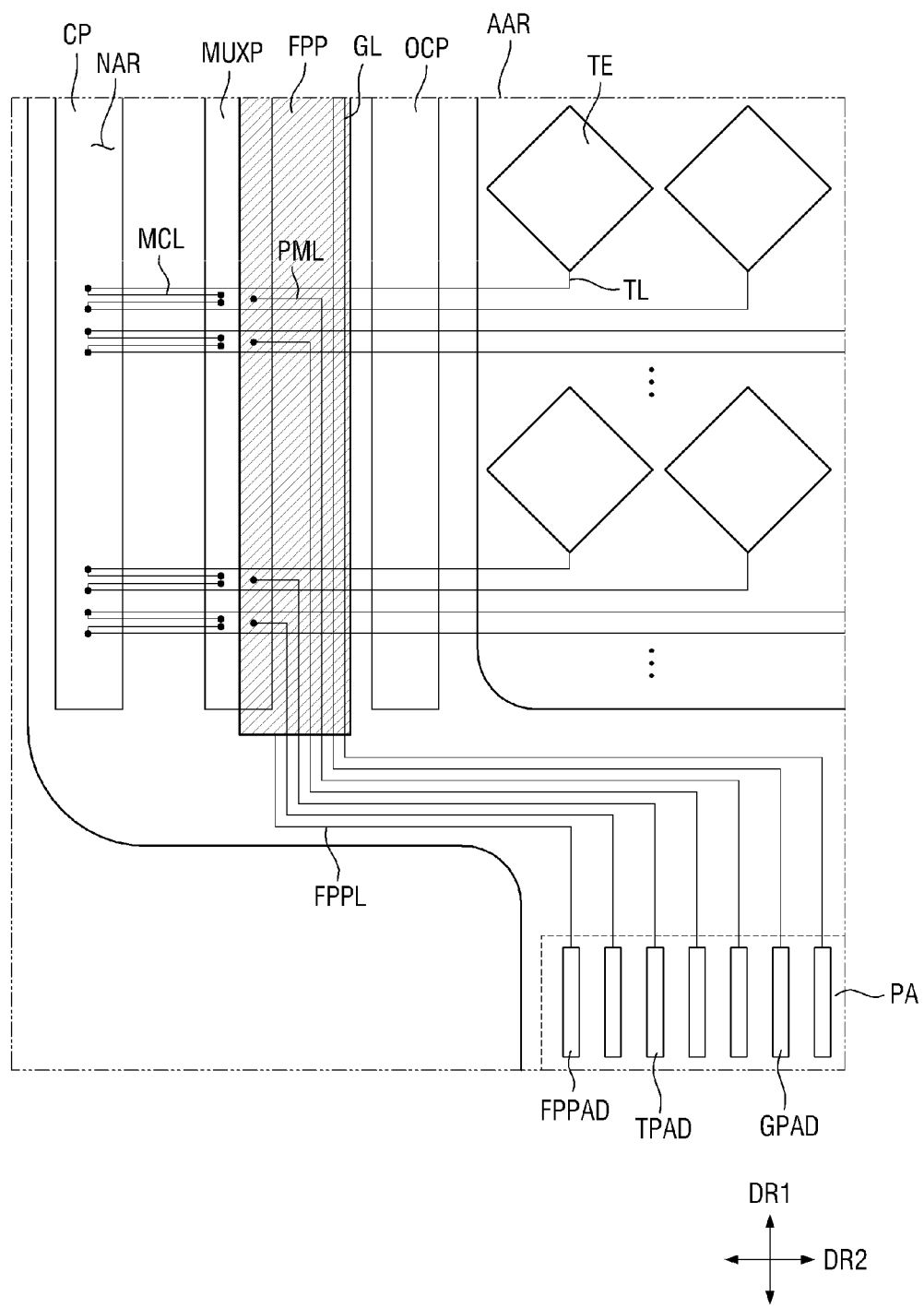
FIG. 5 is an enlarged view of a part of FIG. 4.
Figure 6:
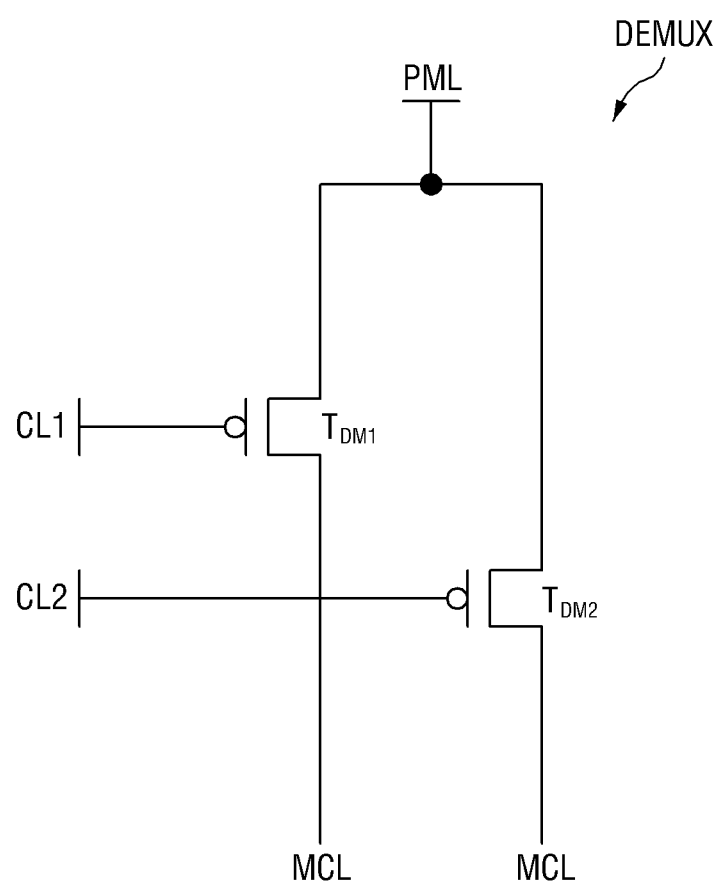
FIG. 6 is a circuit diagram of a demultiplexer included in a demultiplexer circuit unit of a display device according to some example embodiments.
Figure 7:
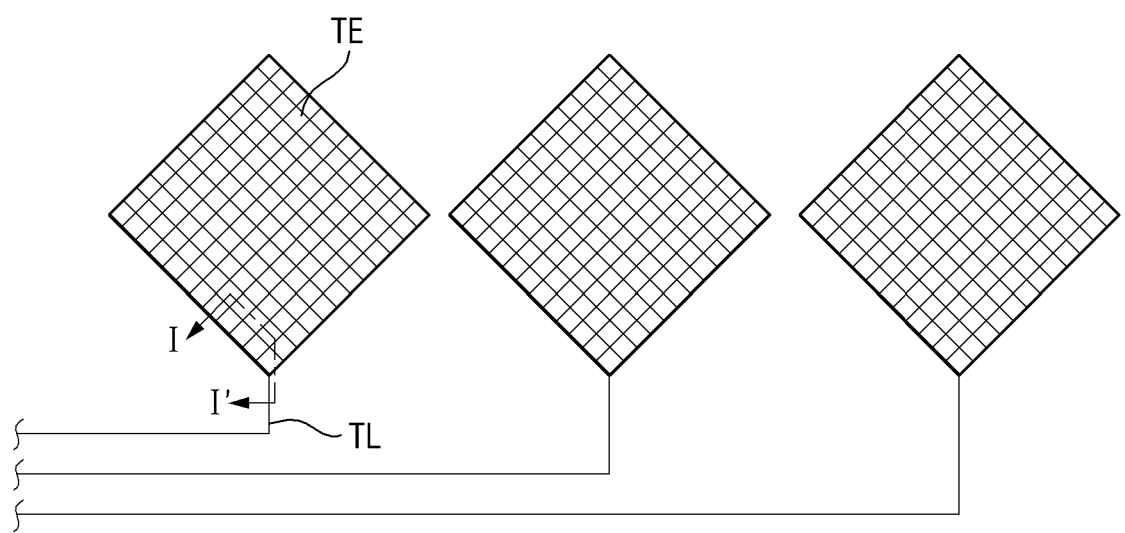
FIG. 7 is an enlarged view of a sensing electrode and a sensing signal line according to some example embodiments.
Figure 8:
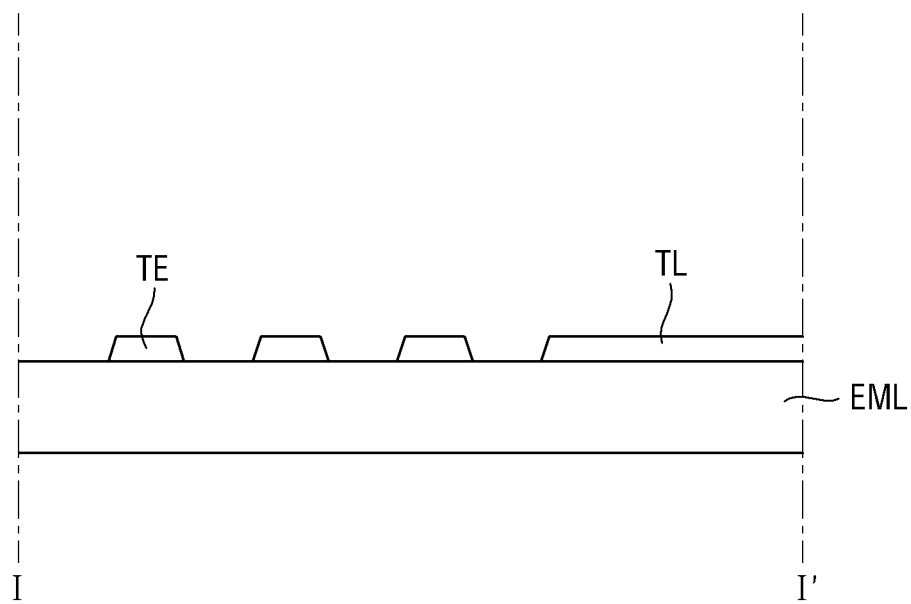
FIG. 8 is a cross-sectional view taken along the line I-I' of FIG. 7.
Figure 9:
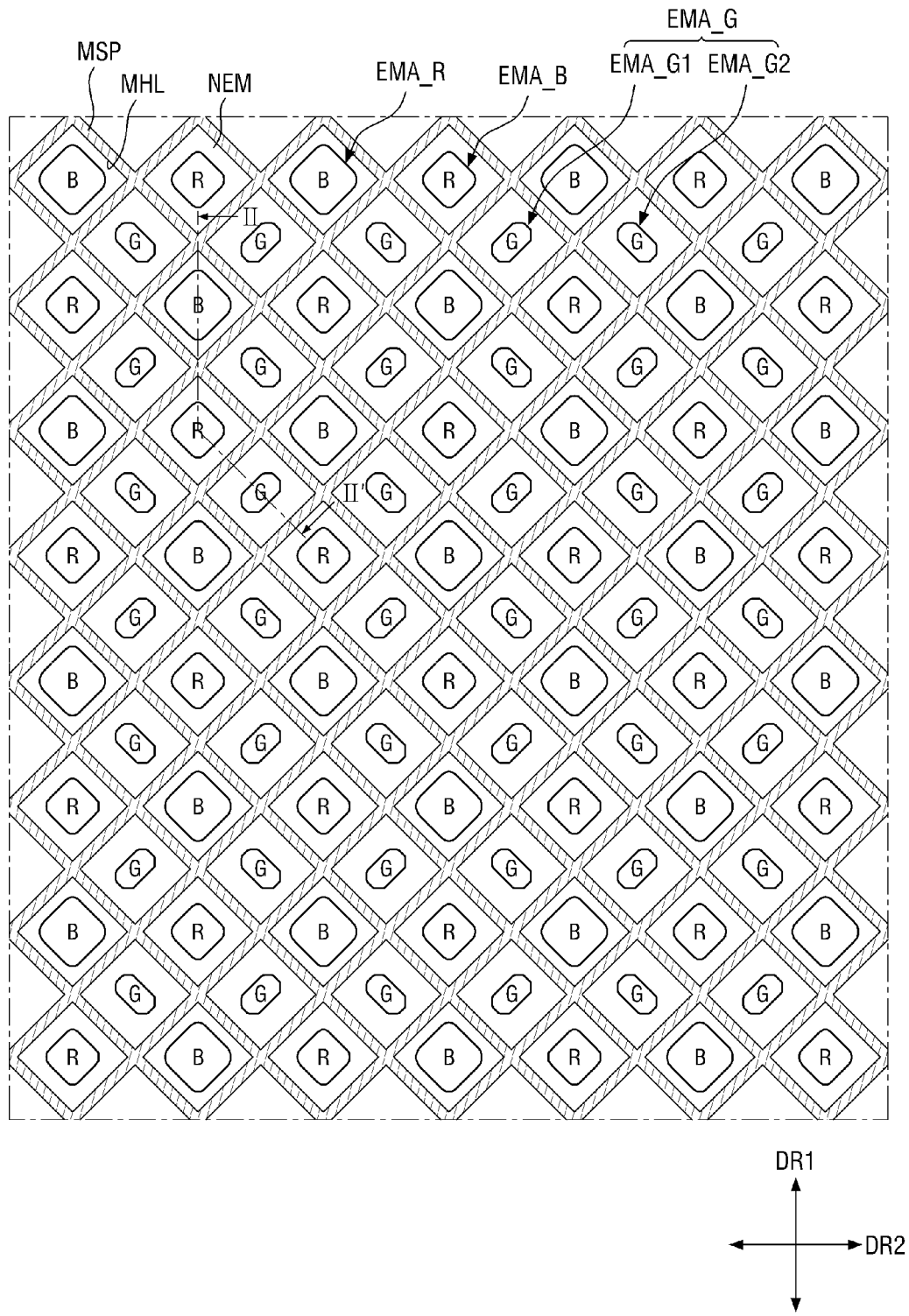
FIG. 9 is a layout view illustrating the arrangement relationship between pixels of a display unit and a mesh pattern of a touch member according to some example embodiments.
Figure 10:
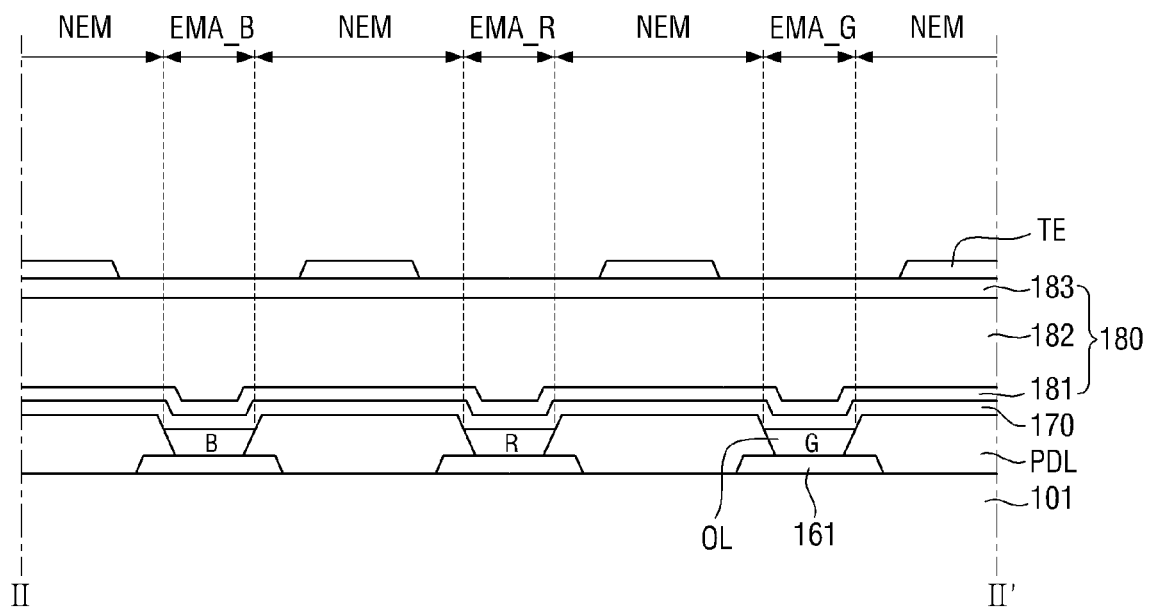
FIG. 10 is a cross-sectional view taken along the line II-II' of FIG. 9.
Figure 11:
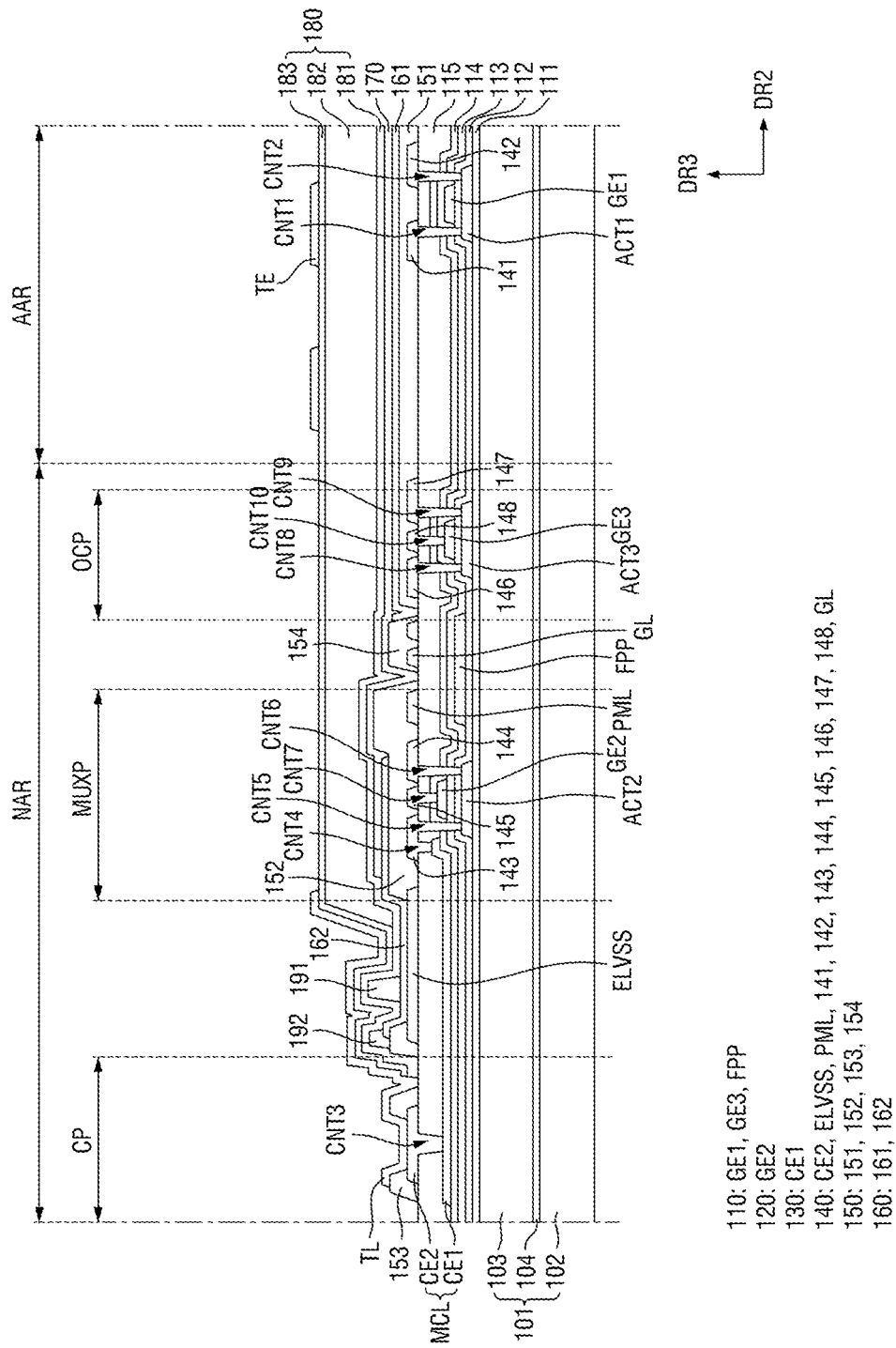
FIG. 11 is a cross-sectional view of a display panel according to some example embodiments.
Figure 12:
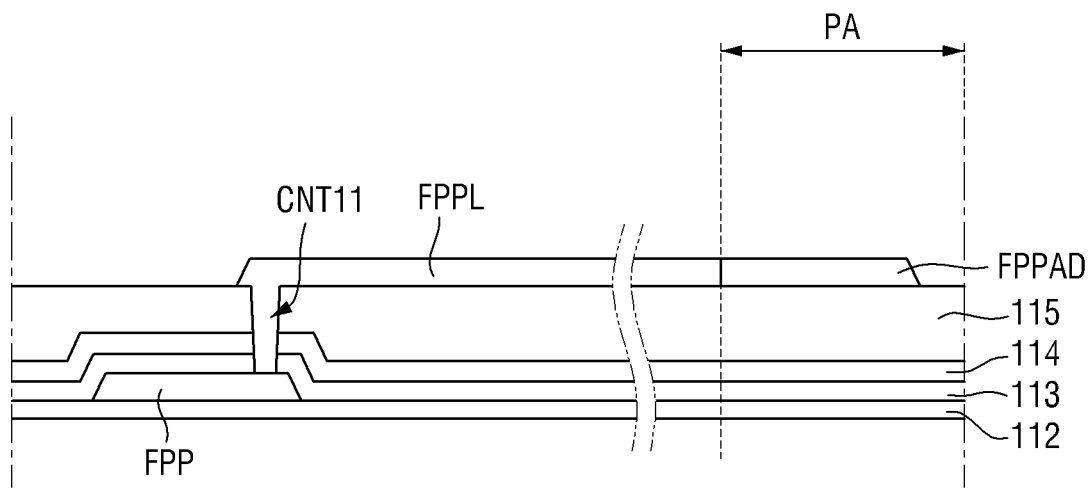
FIG. 12 is a cross-sectional view illustrating the arrangement relationship between a transverse electric field shielding pattern and a transverse electric field shielding pattern pad.

FIG. 4 is a schematic plan layout view of a display panel according to some example embodiments, FIG. 5 is an enlarged view of a part of FIG. 4, FIG. 6 is a circuit diagram of a demultiplexer included in a demultiplexer circuit unit of a display device according to some example embodiments, FIG. 7 is an enlarged view of a sensing electrode and a sensing signal line according to some example embodiments, FIG. 8 is a cross-sectional view taken along the line I-I' of FIG. 7, FIG. 9 is a layout view illustrating the arrangement relationship between pixels of a display unit and a mesh pattern of a touch member according to some example embodiments, FIG. 10 is a cross-sectional view taken along the line II-II' of FIG. 9, FIG. 11 is a cross-sectional view of a display panel according to some example embodiments, and FIG. 12 is a cross-sectional view illustrating the arrangement relationship between a transverse electric field shielding pattern and a transverse electric field shielding pattern pad.

For convenience of explanation, although it is shown in FIGS. 4 and 5 that a non-active area NAR is relatively wider than that in FIG. 1, the size and shape of the non-active area NAR may be substantially the same as those of the non-active area NAR of FIG. 1.

First, referring to FIGS. 4 and 5, a plurality of sensing electrodes TE and a plurality of sensing signal lines TL connected to the plurality of sensing electrodes TE are arranged in an active area AAR of the display panel 10, and the non-active area NAR of the display panel 10 may include a contact unit CP, a demultiplexer unit MUXP, and an external driving circuit unit OCP, which are located at the left edge of the active area AAR in the drawings. The non-active area NAR of the display panel 10 may further include a pad area PA to which a driving substrate 30 is attached.

Although it is illustrated in the present embodiment that the contact unit CP, the demultiplexer unit MUXP, and the external driving circuit unit OCP are located at the left edge of the active area AAR in the drawings, embodiments according to the present invention are not limited thereto, and the contact unit CP, the demultiplexer unit MUXP, and the external driving circuit unit OCP may be located at the right edge of the active area AAR, or may be located at both left side and right side thereof, respectively. Hereinafter, it will be mainly described that the contact unit CP, the demultiplexer unit MUXP, and the external driving circuit unit OCP are located at the left edge of the active area AAR in the drawings.

The plurality of sensing electrodes TE may be arranged in the active area AAR of the display panel 10. The plurality of sensing electrodes TE may be electrodes for sensing a touch input. The plurality of sensing electrodes TE may be arranged along the first direction DR1 and the second direction DR2. The plurality of sensing electrodes TE may be arranged along the matrix direction.

At least some of the sensing electrodes TE may have a rhombus shape. Some sensing electrodes TE may have a figure shape cut from a rhombus shape. The sizes and shapes of the rhombic sensing electrodes TE may be substantially the same as each other.

However, embodiments are not limited to that illustrated above, and the shape and size of the sensing electrodes TE may be variously modified.

Each of the sensing electrodes TE may include a planar pattern or a mesh pattern. When the sensing electrode TE includes a planar pattern, the sensing electrode TE may be formed of a transparent conductive layer. When the sensing electrode TE includes a mesh pattern arranged along the non-light emitting area as illustrated in FIGS. 7 and 9, it may not interfere with the progress of emitted light although an opaque low-resistance metal is applied. Hereinafter, a case where each of the sensing electrodes TE includes a mesh pattern will be described as an example, but embodiments according to the present invention are not limited thereto.

One sensing electrode TE may constitute a unit sensing region. That is, a plurality of unit sensing regions may be arranged in the matrix direction.

In each unit sensing region, a capacitance value between user's touches from one sensing electrode TE and the outside of the display device 1 may be measured, thereby determining whether or not a touch input is performed and calculating the corresponding position as touch input coordinates. Touch sensing may be performed in a self-cap method. When the touching sensing may be performed in a self-cap method, the area of the unit sensing region may be small, as compared with when the touching sensing may be performed in a mutual cap method. When the area of the unit sensing region is small, parasitic capacitance with a conductive layer of the display panel 10 located under the sensing electrode may be reduced.

One sensing signal line TL may be connected to each sensing electrode TE in a one-to-one correspondence. The demultiplexer unit MUXP may be located between the contact unit CP and the active area AAR, and the external driving circuit unit OCP may be located between the demultiplexer unit MUXP and the active area AAR. Each angle sensing signal line TL connected to each sensing electrode TE may extend to the contact unit CP through the external driving circuit OCP and the demultiplexer unit MUXP.

The sensing signal line TL extending to the contact unit CP may be electrically connected to a multiplexer contact line MCL passing through the contact unit CP and the demultiplexer unit MUXP.

The multiplexer contact line MCL and the sense signal line TL may be electrically connected to each other in a one-to-one correspondence. Connection electrodes CE1 and CE2 shown in FIG. 12 may be arranged in the contact unit CP. The sensing signal line TL extending to the contact unit CP may physically contact to the second connection electrode CE2 to be electrically connected to the second connection electrode CE2, and the second connection electrode CE2 may be electrically connected to the first connection electrode CE1 through a third contact hole CNT3. The multiplexer contact line MCL of FIG. 5 may include the first connection electrode CE1 and the second connection electrode CE2 of FIG. 12.

Meanwhile, each sensing electrode TE receives an input signal from the substrate driving chip 35 of the driving substrate 30, and provides an output signal such as a touch input signal to the substrate driving chip 35 through a touch pad. Because the sensing electrodes TE according to the present embodiment are electrically connected to the respective sensing signal lines TL in one-to-one correspondence, the number of touch pads may increase. Thus, in order to provide the number of touch pads needed, a demultiplexer DEMUX for selectively connecting input signals provided to at least two sensing electrodes TE and output signals output from the sensing electrode TE to the substrate driving chip 35 may be further provided.

The multiplexer contact line MCL electrically connected to the sensing signal line TL in one-to-one correspondence may extend from the contact unit CP to the demultiplexer unit MUXP. The multiplexer contact line MCL may be electrically connected to the demultiplexer DEMUX located in the demultiplexer unit MUXP. For example, the multiplexer contact line MCL may be electrically connected to a drain electrode 143 of the demultiplexer DEMUX.

Referring to FIG. 6, the demultiplexer DEMUX includes a first demux transistor $T_{DM1}$ and a second demux transistor $T_{DM2}$. Although it is illustrated in the drawings that both the first demux transistor $T_{DM1}$ and the second demux transistor $T_{DM2}$ are PMOS transistors, embodiments according to the present invention are not limited thereto. Each of the first demux transistor $T_{DM1}$ and the second demux transistor $T_{DM2}$ includes a source electrode, a drain electrode, and a gate electrode.

A panel multiplexer connection line PML may be electrically connected to the source electrode of the first demux transistor $T_{DM1}$. One multiplexer contact line MCL may be connected to the drain electrode of the first demux transistor $T_{DM1}$. A first demux selection signal CL1 may be provided to the gate electrode of the first demux transistor $T_{DM1}$. When the first demux selection signal CL1 of a low level is applied to the gate electrode of the first demux transistor $T_{DM1}$, the first demux transistor $T_{DM1}$ is turned on, and thus any one multiplexer contact line MCL and the panel multiplexer connection line PML may be electrically connected to each other.

The panel multiplexer connection line PML may be electrically connected to the source electrode of the second demux transistor $T_{DM2}$. The drain electrode of the second demux transistor $T_{DM2}$ may be connected to another multiplexer contact line MCL that is not connected to the first demux transistor $T_{DM1}$.

A second demux selection signal CL2 may be provided to the gate electrode of the second demux transistor $T_{DM2}$. When the second demux selection signal CL2 of a low level is applied to the gate electrode of the second demux transistor $T_{DM2}$, the second demux transistor $T_{DM2}$ is turned on, and thus another multiplexer contact line MCL and the panel multiplexer connection line PML may be electrically connected to each other.

When the first demux transistor $T_{DM1}$ and the second demux transistor $T_{DM2}$ are selectively turned on by the aforementioned first demux selection signal CL1 and second demux selection signal CL2, one panel multiplexer connection line PML may be selectively connected to two multiplexer contact lines MCL. According to some example embodiments, when the first demux selection signal CL1 and the second demux selection signal CL2 have different timings, time division driving may be performed.

Meanwhile, although it is illustrated in embodiments that the multiplexer connection line PML is selectively connected to two multiplexer contact lines MCL, according to some example embodiments, the multiplexer connection line PML may be connected to three or four multiplexer contact lines MCL. When one demultiplexer DEMUX selects and connects three or more multiplexer contact lines MCL, the number of demux transistors included in the demultiplexer DEMUX may also be three or more.

The panel multiplexer connection line PML may be electrically connected to the touch pad TPAD located in the pad area PA. As shown in FIG. 5, the panel multiplexer connection line PML may extend from the demultiplexer DEMUX, and may extend along the first direction DR1 to be connected to each touch pad TPAD.

The input signal having an input voltage (e.g., a predetermined input voltage) provided from the substrate driving chip 35 may be provided to the sensing electrode TE through the touch pad TPAD, the panel multiplexer connection line PML, the source electrode and drain electrode of the demultiplexer DEMUX, the multiplexer contact line MCL, and the sensing signal line TL. The output signal (touch input signal) sensed from the sensing electrode TE may be provided to the substrate driving chip 35 through the sensing signal line TL, the multiplexer contact line MCL, the drain electrode and source electrode of the demultiplexer DEMUX, the source electrode, the panel multiplexer connection line PML, and the touch pad TPAD.

Ground lines GL may be further located between the panel multiplexer connection line PML and the external driving circuit unit OCP. Each of the ground lines GL may be electrically connected to a ground line pad GPAD located in the pad area PA. The substrate driving chip 35 may apply a ground voltage to each of the ground lines GL through the ground line pad GPAD.

Meanwhile, the external driving circuit unit OCP may be located adjacent to the panel multiplexer connection line PML. Because the external driving circuit unit OCP is located adjacent to the panel multiplexer connection line PML as shown in FIG. 5, the external driving circuit unit OCP may influence touch signals passing through the panel multiplexer connection line PML. In order to reduce the transverse electric field interference of the touch signals passing through the panel multiplexer connection line (PML) by the external driving circuit unit OCP located adjacent to the panel multiplexer connection line PML, a transverse electric field blocking pattern FFP may be further located on the lower portion of the panel multiplexer connection line PML.

The transverse electric field blocking pattern FFP may overlap the demultiplexer unit MUXP, and may overlap the pad multiplexer connection line PML. The transverse electric field blocking pattern FFP may also overlap the adjacent ground lines GL. That is, the transverse electric field blocking pattern FFP may cover a part of the demultiplexer unit MUXP, the pad multiplexer connection line PML, and the ground lines GL. The transverse electric field blocking pattern FFP may not overlap the external driving circuit unit OCP.

The transverse electric field blocking pattern FFP is arranged to overlap the lower portion of the panel multiplexer connection line PML to block the transverse electric field between the panel multiplexer connection line PML and the external driving circuit unit OCP adjacent to the panel multiplexer connection line PML, and in this case, an electric field may also be formed between the transverse electric field blocking pattern FFP and the panel multiplexer connection line PML. Due to the electric field formed between the transverse field blocking pattern FPP and the panel multiplexer connection line PML, input signals and output signals transmitted through the panel multiplexer connection line PML may be interfered. Thus, a voltage (e.g., a predetermined voltage) may be applied to the transverse electric field blocking pattern FFP. As the method of applying the voltage (e.g., the predetermined voltage) to the transverse field blocking pattern FPP, there is illustrated a method of further providing a transverse electric field pattern line FPPL connected to the transverse electric field blocking pattern FFP and further disposing a transverse electric field pattern pad FPPAD in the pad area PA. For example, when an input signal is applied from the substrate driving chip 35 to the touch pad TPAD, a first voltage having the same voltage magnitude as that of the input signal applied to the transverse field blocking pattern pad FPPAD may be applied, and when an output signal is provided from the touch pad TPAD to the substrate driving chip 35, a second voltage having the same voltage magnitude as that of the output signal provided to the transverse field blocking pattern pad FPPAD may be applied. Thus, the transverse electric field blocking pattern FFP is subjected to a voltage of the same level as the panel multiplexer connection line PML arranged in the thickness direction, so that, due to the electric field formed between the transverse field blocking pattern FPP and the panel multiplexer connection line PML, it is possible to prevent the input signals and output signals transmitted through the panel mulitiplexer connection line PML from being interfered.

Referring to FIGS. 7 and 8, as described above, each sensing electrode TE may be formed in a mesh pattern. When each sensing electrode TE has a rhombus shape in the drawing, the mesh pattern constituting each sensing electrode TE may be formed by a first line extending along an inclined direction of the first direction DR1 and second lines intersecting the first line.

Each sensing electrode TE and the sensing signal line TL electrically connected in correspondence with each sensing electrode TE may be directly arranged on the encapsulation layer ENL. The sensing electrode TE and the sensing signal line TL may be arranged on the same layer, and may be made of the same material.

Each sensing electrode TE and the sensing signal line TL electrically connected in correspondence with each sensing electrode TE may include a metal conductive layer or a transparent conductive layer. The metal layer may include aluminum, titanium, copper, molybdenum, silver, or an alloy thereof.

The transparent conductive layer may include a transparent conductive oxide such as indium tin oxide (ITO), indium zinc oxide (IZO), zinc oxide (ZnO), or indium tin zinc oxide (ITZO); a conductive polymer such as PEDOT; metal nanowires; or graphene. As described above, when each sensing electrode TE is arranged on a non-light emitting area, each sensing electrode TE may not interfere with the progress of emitted light even when each sensing electrode TE is made of a low-resistance opaque metal.

Each sensing electrode TE and the sensing signal line TL electrically connected in correspondence with each sensing electrode TE may include a conductive layer having a multi-layer structure. For example, each sensing electrode TE and the sensing signal line TL electrically connected in correspondence with each sensing electrode TE may include a conductive layer having a three-layer structure of titanium/aluminum/titanium.

Referring to FIG. 9, the display area of the active area AAR includes a plurality of pixels. Each pixel includes a light emitting area EMA. The light emitting area EMA may overlap an opening of a bank layer PDL and may be defined by the opening of the bank layer PDL. The non-light emitting area NEM is located between the light emitting areas EMA of each pixel. The non-light emitting area NEM may overlap the bank layer PDL and may be defined by the bank layer PDL. The non-light emitting area NEM may surround the light emitting area EMA. The non-light emitting area NEM has a grid shape or a mesh shape arranged along a diagonal direction crossing the first direction DR1 and the second direction DR2 when viewed in a plan view. The mesh pattern MSP may be arranged in the non-light emitting area NEM.

The pixel may include a first color pixel (for example, a red pixel), a second color pixel (for example, a blue pixel), and a third color pixel (for example, a green pixel). The first color generally has a wavelength band ranging from about 640 nm to about 750 nm, which is perceived as red, the second color generally has a wavelength band ranging from about 492 nm to about 600 nm, which is perceived as green, and the third color generally has a wavelength band ranging from about 450 nm to about 480 nm, which is perceived as blue.

The shape of the light emitting area EMA of each color pixel may be generally an octagon or a quadrangle or rhombus having rounded corners. However, embodiments according to the present invention are not limited thereto, and the shape of each light emitting area EMA may be a circle, a rhombus, a polygon, or a polygon having rounded corners.

According to some example embodiments, the shape of the light emitting area EMA_R of the first color pixel and the shape of the light emitting area EMA_B of the second color pixel may have similar shapes to each other, that is, a rhombus having rounded corners. The light emitting area EMA_B of the second color pixel may be larger than the light emitting area EMA_R of the first color pixel.

The light emitting area EMA_G of the third color pixel may be smaller than the light emitting area EMA_R of the first color pixel. The light emitting area EMA_G of the third color pixel may be inclined in a diagonal direction and have an octagonal shape having a maximum width in the inclined direction. The third color pixels may include a third color pixel in which the light emitting area EMA_G1 is inclined in a first diagonal direction and a third color pixel in which the light emitting area EMA_G2 is inclined in a second diagonal direction.

The color pixels may be arranged in various ways. According to some example embodiments, the first color pixels (for example, red pixels) and the second color pixels (for example, blue pixels) are alternately arranged in a first row along the second direction DR2, and the third color pixels (for example, green pixels) may be arranged in a second row adjacent to the first row along the second direction DR2. The pixels (third color pixels) belonging to the second row may be alternately arranged in the second direction DR2 with respect to the pixels belonging to the first row. In the second row, the third color pixels inclined in a first diagonal direction and the third color pixels (refer to EMA_G1) inclined in a second diagonal direction may be alternately arranged along the second direction DR2. The number of the third color pixels belonging to the second row may be twice the number of the first color pixels or the second color pixels belonging to the first row.

The third row has the same arrangement of color pixels as the first row, but the arrangement order may be reversed. That is, the second color pixels may be arranged in the third row belonging to the same column as the first color pixels in the first row, and the first color pixels may be arranged in the third row belonging to the same column as the second color pixels in the first row. The fourth row has the same arrangement of the third color pixels as the second row, but the arrangement order may be reversed based on the shape inclined in the diagonal direction. That is, the third color pixels inclined in the second diagonal direction may be arranged in the fourth row belonging to the same column as the third color pixels inclined in the first diagonal direction of the second row, and the third color pixels inclined in the first diagonal direction may be arranged in the fourth row belonging to the same column as the third color pixels inclined in the second diagonal direction of the second row.

The arrangements of the first to fourth rows may be repeated along the first direction DR1. However, of course, the arrangement of the pixels is not limited to the above illustration.

The mesh pattern MSP may be arranged in the non-light emitting area NEM along the boundary of the pixels. The mesh pattern MSP may not overlap the light emitting area EMA. The width of the mesh pattern MSP may be smaller than the width of the non-light emitting area NEM. According to some example embodiments, the mesh hole MHL exposed by the mesh pattern MSP may have a substantially rhombus shape.

Although the sizes of the mesh holes MHL may be the same, they may be different from each other depending on the size of the light emitting area EMA exposed by the mesh hole MHL, or may be different from each other regardless of the size of the light emitting area EMA. Although it is illustrated in the drawings that one mesh hole MHL corresponds to one light emitting area EMA, embodiments according to the present invention are not limited thereto, and one mesh hole MHL may correspond to two or more light emitting areas EMA.

In the cross-sectional view of FIG. 10, most of the layers under the anode electrode 161 are omitted, and the structures on the organic light emitting diode are illustrated.

Referring to FIG. 10, a substrate 101 of the display device 1 may be made of an insulating material such as a polymer resin. Examples of the polymer resin may include polyethersulphone (PES), polyacrylate (PA), polyarylate (PAR), polyetherimide (PEI), polyethylene napthalate (PEN), polyethylene terepthalate (PET), polyphenylene sulfide: (PPS), polyallylate, polyimide (PI), polycarbonate (PC), cellulose triacetate (CAT), cellulose acetate propionate (CAP), and combinations thereof. The substrate 101 may be a flexible substrate capable of bending, folding, rolling, or the like. An example of the material forming the flexible substrate may include, but is not limited to, polyimide (PI).

An anode electrode 161 is located on the substrate 101. In the drawings, for convenience of explanation, a case where the anode electrode 161 is located directly on the substrate 101. However, as is well known in the art, a plurality of thin film transistors and a plurality of signal lines are arranged between the substrate 101 and the anode electrode 161.

The anode electrode 161 may be a pixel electrode arranged for each pixel. The anode electrode 161 may have a laminated film structure in which a material layer having a high work function including indium-tin-oxide (ITO), indium-zinc-oxide (IZO), zinc oxide (ZnO), or induim oxide ($In_2O_3$) and a reflective material layer including silver (Ag), magnesium (Mg), aluminum (Al), platinum (Pt), lead (Pd), gold (Au), nickel (Ni), neodium (Nd), iridium (Ir), chromium (Cr), lithium (Li), calcium (Ca) or a mixture thereof are laminated. The material layer having a higher work function may be formed over the reflective material layer and thus closer to the light emitting layer 175. The anode electrode 161 may have a multi-layer structure of ITO/Mg, ITO/MgF, ITO /Ag, and ITO/Ag/ITO, but the structure thereof is not limited thereto.

A bank layer PDL may be formed on the substrate 101. The bank layer PDL may be formed or located on the anode electrode 161, and may include an opening that exposes the anode electrode 161. The light emitting area EMA and the non-light emitting area NEM may be divided by the bank layer PDL and the opening thereof. The bank layer PDL may include an organic insulating material such as polyacrylate resin, epoxy resin, phenolic resin, polyamide resin, polyimide resin, unsaturated polyester resin), polyphenylene ether resin, polyphenylene sulfide resin, or benzocyclobutene (BCB). The bank layer PDL may include an inorganic material.

A light emitting layer is formed or located on the anode 161 exposed by the bank layer PDL. The light emitting layer may include an organic layer OL. The organic layer OL may include an organic light emitting layer, and may further include a hole injection/transport layer and/or an electron injection/transport layer.

The wavelengths of light emitted by the light emitting layers may be different for each color pixel. For example, the light emitting layers may include a first color light emitting layer located in the light emitting area EMA_R of the first color pixel, a second color light emitting layer located in the light emitting area EMA_B of the second color pixel, and a third color light emitting layer located in the light emitting area EMA_G of the third color pixel. The first color light emitting layer may emit light of a red wavelength band, the second color light emitting layer may emit light of a blue wavelength band, and the third color light emitting layer may emit light of a green wavelength band.

A cathode electrode 170 may be arranged or located on the light emitting layer. The cathode electrode 170 may be a common electrode entirely arranged on the light emitting layer without distinguishing the pixels. The anode electrode 161, the light emitting layer, and the cathode electrode 170 may constitute an organic light emitting element.

The cathode electrode 170 not only may contact the light emitting layer but also may contact the upper surface of the bank layer PDL. The cathode electrode 170 may be conformally formed with respect to a lower structure to reflect the step of the lower structure.

The cathode electrode 170 may include a material layer having a low work function, the material layer including Li, Ca, LiF/Ca, LiF/Al, Al, Mg, Ag, Pt, Pd, Ni, Au Nd, Ir, Cr, BaF, Ba, or a compound or mixture thereof (for example, a mixture of Ag and Mg). The cathode electrode 170 may further include a transparent metal oxide layer located on the material layer having a low work function.

A thin film encapsulation layer 180 including a first inorganic film 181, an organic film 182, and a second inorganic film 183 is located on the cathode electrode 170. Each of the first inorganic film 181 and the second inorganic film 183 may include silicon nitride, silicon oxide, or silicon oxynitride. The organic film 182 may include an organic insulating material such as polyacrylate resin, epoxy resin, phenolic resin, polyamide resin, polyimide resin, unsaturated polyester resin), polyphenylene ether resin, polyphenylene sulfide resin, or benzocyclobutene (BCB).

The sensing electrode TE may be located on the thin film encapsulation layer 180, and a redundant description thereof will be omitted. FIG. 10 is a cross-sectional view of the sensor unit, and therefore, the sensing signal line TL is not shown in the cross-sectional view.

The sensing electrode TE may overlap the bank layer PDL, and may be located in the non-light emitting area NEM. Because the mesh patterns MSP forming the sensing electrode TE do not overlap the light emitting area EMA, the mesh patterns MSP do not interfere with light emission, and may not be visible to the user.

Referring to FIG. 11, the substrate 101 may be arranged or located over the active area AAR and the inactive area NAR. The substrate 101 may include a plurality of laminated films. The substrate 101 may include a first laminated film 102, a second laminated film 103 located on the first laminated film 102, and a substrate bonding layer 104 located between the first laminated film 102 and the second laminated film 103. Each of the laminated films 102 and 103 may include a flexible organic insulating material. The substrate bonding layer 104 may include an adhesive layer.

However, the structure of the substrate 101 is not limited thereto, and the substrate 101 may have a structure in which the second laminated film 103 and the substrate bonding layer 104, except for the first laminated film 102, may be omitted, and a barrier layer 111 to be described later may be located on the first laminated film 102.

The barrier layer 111 may be located on the substrate 101. The barrier layer 111 may include an inorganic material. Unlike that shown in FIG. 11, the barrier layer 111 may include a plurality of laminated films. According to some example embodiments, a buffer layer may be further located between the barrier layer 111 and the substrate 101 or between the barrier layer 111 and semiconductor layers ACT1, ACT2, and ACT3 to be described later.

The semiconductor layers ACT1, ACT2, and ACT3 may be located on the barrier layer 111. The first semiconductor layer ACT1 may be located in the active area AAR, the second semiconductor layer ACT2 may be located in the demultiplexer unit MUXP, and the third semiconductor layer ACT3 may be located in the external driving circuit unit OCP.

Agate insulating layer 112 may be located on the semiconductor layers ACT1, ACT2, and ACT3. The gate insulating layer 112 may perform an insulating function between the semiconductor layers ACT1, ACT2, and ACT3 and gate electrodes GE1, GE2, and GE3 to be described later. The first gate insulating layer 112 may include an inorganic material.

A first conductive layer 110 may be located on the gate insulating layer 112. The first conductive layer 110 may include a first gate electrode GE1 located in the active area AAR, a third gate electrode GE3 located in the external driving circuit unit OCP, a demultiplexer unit MUXP, and a transverse electric field blocking pattern FPP located between the demultiplexer unit MUXP and the external driving circuit unit OCP. The first gate electrode GE1 may be a gate electrode of the thin film transistor located in the active area AAR, and the third gate electrode GE3 may be a gate electrode of the thin film transistor located in the external driving circuit unit OCP.

The first conductive layer 110 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The first conductive layer 110 may be a single-layer film made of any suitable conductive material, including the example materials listed above. However, embodiments according to the present invention are not limited thereto, and the first conductive layer 110 may be a laminated film.

A second gate insulating layer 113 may be located on the first conductive layer 110. The second gate insulating layer 113 may serve to insulate the first conductive layer 110 and a second conductive layer 120 to be described later. The second gate insulating layer 113 may include an inorganic material.

The second conductive layer 120 may be located on the second gate insulating layer 113. The second conductive layer 120 may include a second gate electrode GE2 located in the demultiplexer unit MUXP. The second gate electrode GE2 may be a gate electrode of the thin film transistor of the demultiplexer DEMUX located in the demultiplexer unit MUXP. The second conductive layer 120 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The second conductive layer 120 may be a single-layer film made of any suitable conductive material, for example, the materials listed above. However, embodiments according to the present invention are not limited thereto, and the second conductive layer 120 may be a laminated film.

A first interlayer insulating film 114 may be located on the second conductive layer 120. The first interlayer insulating film 114 may function to insulate the second conductive layer 120 and a third conductive layer 130 to be described later. The first interlayer insulating film 114 may include an inorganic material.

The third conductive layer 130 may be located on the first interlayer insulating film 114. The third conductive layer 130 may include a first connection electrode CE1 or a gate connection electrode located over the contact unit CP, the demultiplexer unit MUXP, and a region between the contact unit CP and the demultiplexer unit MUXP. The first connection electrode CE1 may be electrically connected to the second connection electrode CE2 and the drain electrode 143 of the thin film transistor of the demultiplexer DEMUX located in the demultiplexer unit MUXP. The third conductive layer 130 may include at least one metal selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). The third conductive layer 130 may be a single-layer film made of any suitable conductive material, for example, the example materials listed above. However, embodiments according to the present invention are not limited thereto, and the third conductive layer 130 may be a laminated film.

A second interlayer insulating film 115 may be located or formed on the third conductive layer 130. The second interlayer insulating film 115 may include an inorganic material or an organic material. The second interlayer insulating film 115 may function to insulate the third conductive layer 130 and a fourth conductive layer 140 to be described in more detail below.

The fourth conductive layer 140 may be located on the second interlayer insulating film 115. The fourth conductive layer 140 may include a drain electrode 141 and a source electrode 142 of the thin film transistor of the pixel located in the active area AAR, a drain electrode 143 and a source electrode 144 of the thin film transistor of the demultiplexer DEMUX located in the demultiplexer unit MUXP, a selection signal line 145 electrically connected to the second gate electrode GE2 of the thin film transistor of the demultiplexer DEMUX, a drain electrode 146 and a source electrode 147 of the thin film transistor of the external driving circuit unit OCP, a second connection electrode CE2 or a source connection electrode located on the contact unit CP, and a low voltage supply line ELVSS located in an area between the contact unit CP and the demultiplexer unit MUXP.

The drain electrode 141 and the source electrode 142 of the thin film transistor of the pixel may be electrically connected to the first semiconductor layer ACT1 through contact holes CNT1 and CNT2, respectively, the drain electrode 143 and the source electrode 144 of the thin film transistor of the demultiplexer DEMUX may be electrically connected to the second semiconductor layer ACT2 through contact holes CNT5 and CNT6, respectively. and the drain electrode 146 and the source electrode 147 of the thin film transistor of the external driving circuit unit OCP may be electrically connected to the third semiconductor layer ACT3 through contact holes CNT8 and CNT9, respectively. Further, the second connection electrode CE2 may be electrically connected to the first connection electrode CE1 through the third contact hole CNT3, the drain electrode 143 of the thin film transistor of the demultiplexer DEMUX may be electrically connected to the first connection electrode CE1 through the fourth contact hole CNT4, and the selection signal line 145 may be electrically connected to the second gate electrode GE2 through the seventh contact hole CNT7. Meanwhile, the fourth conductive layer 140 may further include an external driving circuit control signal line 148 electrically connected to the third gate electrode GE3 of the thin film transistor of the external driving circuit unit OCP through the tenth contact hole CNT10.

Further, the fourth conductive layer 140 may further include a ground line GL located in an area between the demultiplexer unit MUXP and the external driving circuit unit OCP.

A first insulating layer 150 may be located on the fourth conductive layer 140. The first insulating layer 150 may include: a first insulating pattern 151 located on the drain electrode 141 and the source electrode 142 of the thin film transistor of the pixel located in the active area AAR and the drain electrode 146 and the source electrode 147 of the thin film transistor of the external driving circuit unit OCP to cover these components; a second insulating pattern 152 located on the drain electrode 143 and the source electrode 144 of the thin film transistor of the demultiplexer DEMUX located in the demultiplexer unit MUXP and the pad multiplexer connection line PML to cover these components; a third insulating pattern 153 located on the second connection electrode CE2 to partially exposed the upper surface of the second connection electrode CE2; and a fourth insulating pattern 154 located on the ground line GL to cover the ground line GL. The first insulating layer 150 may include an organic insulating material.

The insulating patterns 151 to 154 may be spaced apart from each other.

A fifth conductive layer 160 may be located on the first insulating layer 150. Because the material of the fifth conductive layer 160 is the same as that of the anode electrode 161 described above with reference to FIG. 10, a redundant description thereof will be omitted.

The fifth conductive layer 160 may include: an anode electrode 161 located in the active area AAR, the external driving circuit unit OCP, and an area between the external driving circuit unit OCP and the demultiplexer unit MUXP; and a third connection electrode 162 physically spaced apart from the anode electrode 161 and located over an area between the demultiplexer unit MUXP and the contact unit CP. The anode electrode 161 and the third connection electrode 162 may not overlap the pad demultiplexer connection line PML, respectively. That is, the space between the anode electrode 161 and the third connection electrode 162 may overlap the pad demultiplexer connection line PML in the thickness direction. Thus, it is possible to prevent a parasitic cap from being formed between the pad demultiplexer connection line PML and the fifth conductive layer 160 electrically connected to a low voltage supply line ELVSS to be described later.

The second insulating pattern 152 of the first insulating layer 150 exposes the upper surface of the low voltage supply line ELVSS, and the third connection electrode 162 may directly contact the low voltage supply line ELVSS having an exposed upper surface.

A fifth insulating pattern 191 and a sixth insulating pattern 192, which are located between the contact unit CP and the demultiplexer unit MUXP, may be located on the fifth conductive layer 160. Each of the fifth insulating pattern 191 and the sixth insulating pattern 192 may include an organic insulating material. The fifth insulating pattern 191 is located closer to the demultiplexer unit MUXP than the sixth insulating pattern 192, and may be directly located on the third connection electrode 162. The sixth insulating pattern 192 may be in direct contact with the upper surface located on the second insulating pattern 152 and the third connection electrode 162 and exposed by the third connection electrode 162 of the second insulating pattern 152 and the third connection electrode 162. The sixth insulating pattern 192, the second insulating pattern 152 overlapping the sixth insulating pattern 192 in the thickness direction, and the fifth insulating pattern 191 may serve as dams. That is, the sixth insulating pattern 192 and the second insulating pattern 152 overlapped with the sixth insulating pattern 192 in the thickness direction may be a second dam, and the fifth insulating pattern 191 may be a first dam.

A cathode electrode 170 may be located on the fifth insulating pattern 191 and the sixth insulating pattern 192. The cathode electrode 170 may be located over the active area AAR, the external driving circuit unit OCP, and the demultiplexer unit MUXP, may be in direct contact with the anode electrode 161 in the active area AAR and the external driving circuit unit OCP to be electrically connected to the anode electrode 161, and may be in direction contact with the third connection electrode 162 under the demultiplexer unit MUXP to be electrically connected to the third connection electrode 162. The cathode electrode 170 may be in direction contact with the third connection electrode 162 under the demultiplexer unit MUXP to be electrically connected to the third connection electrode 162, and may thus be electrically connected to the low voltage supply line ELVSS.

A thin film encapsulation layer 180 may be located on the cathode electrode 170. The first inorganic film 181 and the second inorganic film 183 may extend from the active area AAR to the first dam and the second dam, respectively. The first inorganic film 181 may be in direct contact with the first dam and the second dam. The organic film 182 may extend from the active area AAR to the demultiplexerr unit MUXP, and may have a smaller extension length than the inorganic films 181 and 182.

The touch electrodes TE may be located on the thin film encapsulation layer 180. The touch electrodes TE may be directly located on the thin film encapsulation layer 180.

Referring to FIG. 12, the transverse electric field blocking pattern line FPPL may be electrically connected to the transverse electric field blocking pattern FFP through the eleventh contact hole CNT11. The transverse electric field blocking pattern line FPPL may be physically connected to the transverse electric field blocking pattern pad FPPAD located in the pad area PA.

Figure 13:
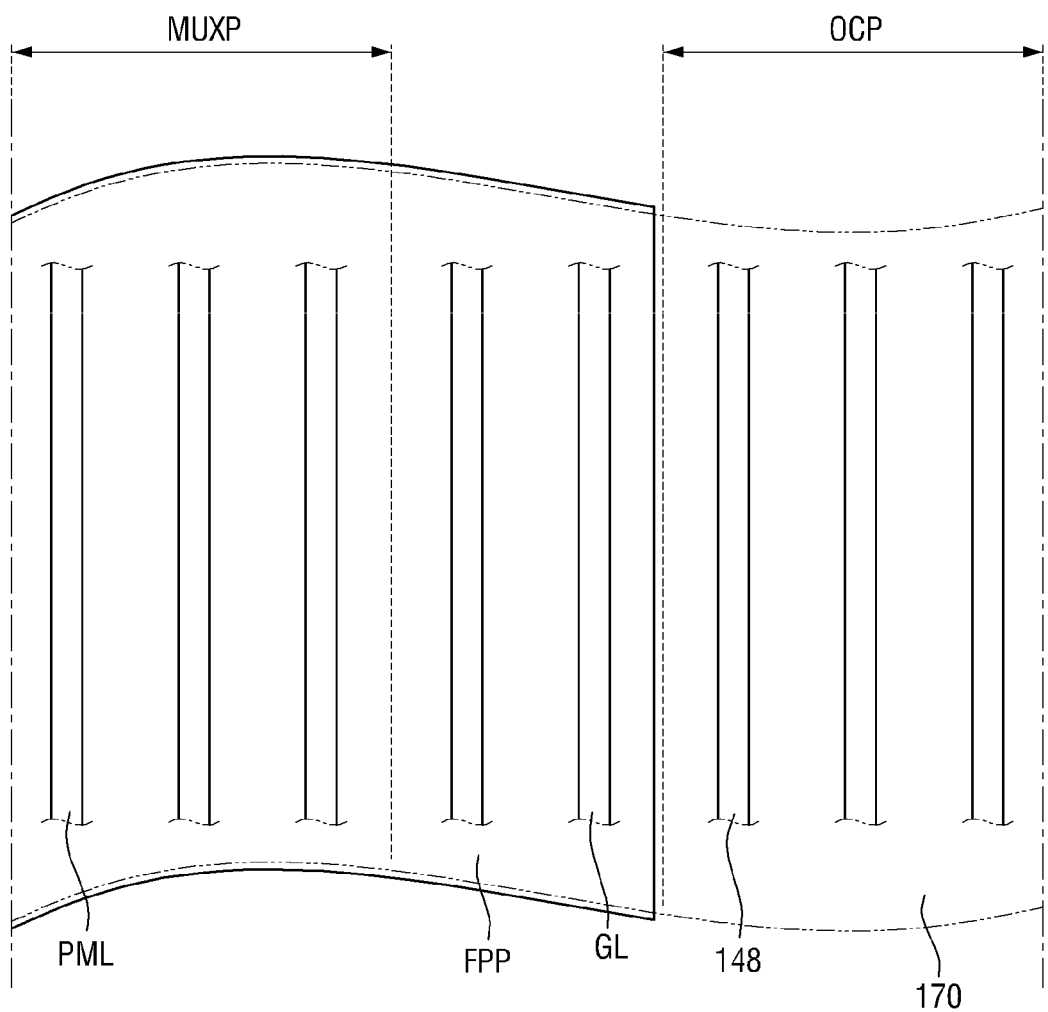
FIG. 13 is a plan layout view illustrating the arrangement relationship between a pad multiplexer connection line and an input signal line of an external driving circuit.
Figure 13:
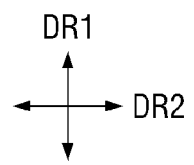
Figure 14:
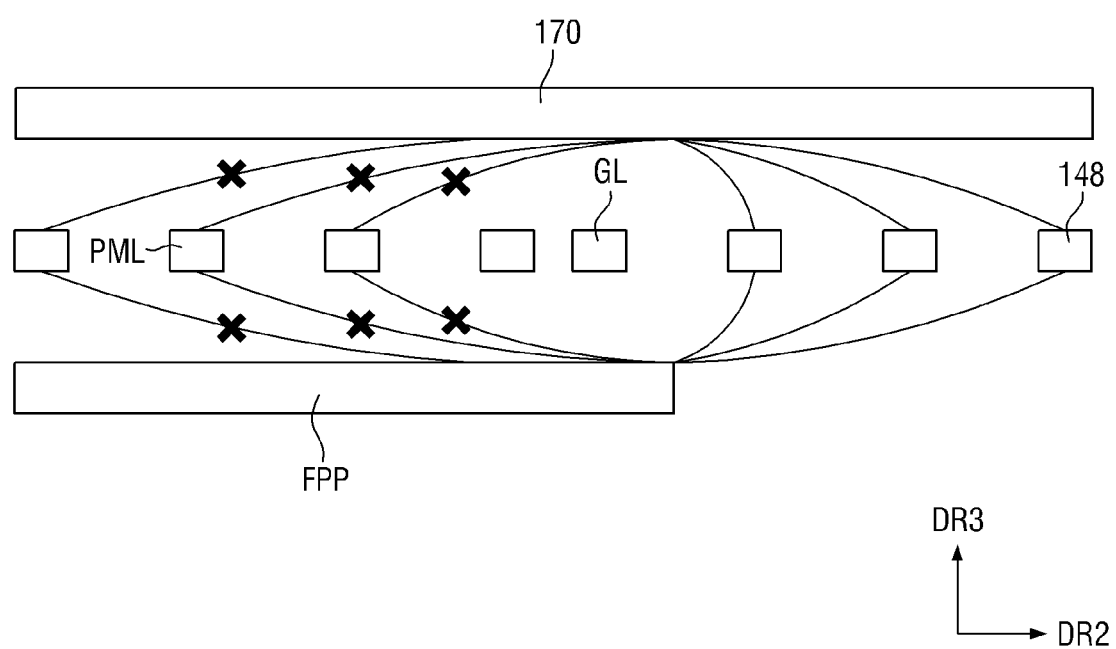
FIG. 14 is a schematic cross-sectional view of FIG. 13.

FIG. 13 is a plan layout view illustrating the arrangement relationship between a pad multiplexer connection line and an input signal line of an external driving circuit, and FIG. 14 is a schematic cross-sectional view of FIG. 13.

Referring to FIGS. 13 and 14, the input signal line 148 connected to the thin film transistor of the external driving circuit unit OCP may extend in parallel with the pad demultiplexer connection line PML. That is, the input signal line 148 connected to the thin film transistor of the external driving circuit unit OCP may extend along the first direction DR1. The cathode electrode 170 and the transverse electric field blocking pattern FFP may be located on the input signal line 148 and the pad demultiplexer connection line PML, respectively. The cathode electrode 170 may be located on the input signal line 148 and the pad demultiplexer connection line PML, and the transverse electric field blocking pattern FFP may be located on the input signal line 148 and the lower portion of the pad demultiplexer connection line PML. The cathode electrode 170 may completely cover the input signal line 148 and the pad demultiplexer connection line PML in a plan view, and the transverse electric field blocking pattern FFP may cover the pad demultiplexer connection line PML and the adjacent ground line GL. The transverse electric field blocking pattern FFP may not overlap the input signal line 148.

As shown in FIG. 14, a transverse electric field may be generated between the input signal line 148 and the pad demultiplexer connection line PML. As shown in FIGS. 13 and 14, when the plurality of pad demultiplexer connection lines PML and the plurality of input signal lines 148 are arranged, a transverse electric field may be generated between the pad demultiplexer connection line PML and the input signal line 148 having the same or similar distance with respect to the ground line GL. The transverse electric field may include a first transverse electric field that draws a convex parabola toward the cathode electrode 170 and a second transverse electric field that draws a convex parabola toward the transverse electric field blocking pattern FFP. The transverse electric field generated between the pad demultiplexer connection line PML and the input signal line 148 may generate signal noise of the pad demultiplexer connection line PML.

The first transverse electric field may be blocked by the input signal line 148 and the cathode electrode 170 located over the pad demultiplexer connection line PML. Moreover, the second transverse electric field may overlap the pad demultiplexer connection line PML in the thickness direction to be blocked by the transverse electric field blocking pattern FFP covering the pad demultiplexer connection line PML. Thus, it is possible to reduce or block signal aging of the pad demultiplexer connection line PML, which may be caused by a transverse electric field generated between the pad demultiplexer connection line PML and the external driving circuit unit OCP.

Hereinafter, other embodiments will be described. In the following embodiments, the same components as those in the already described embodiment are referred to by the same reference numerals, and a description thereof will be omitted or simplified.

Figure 15:
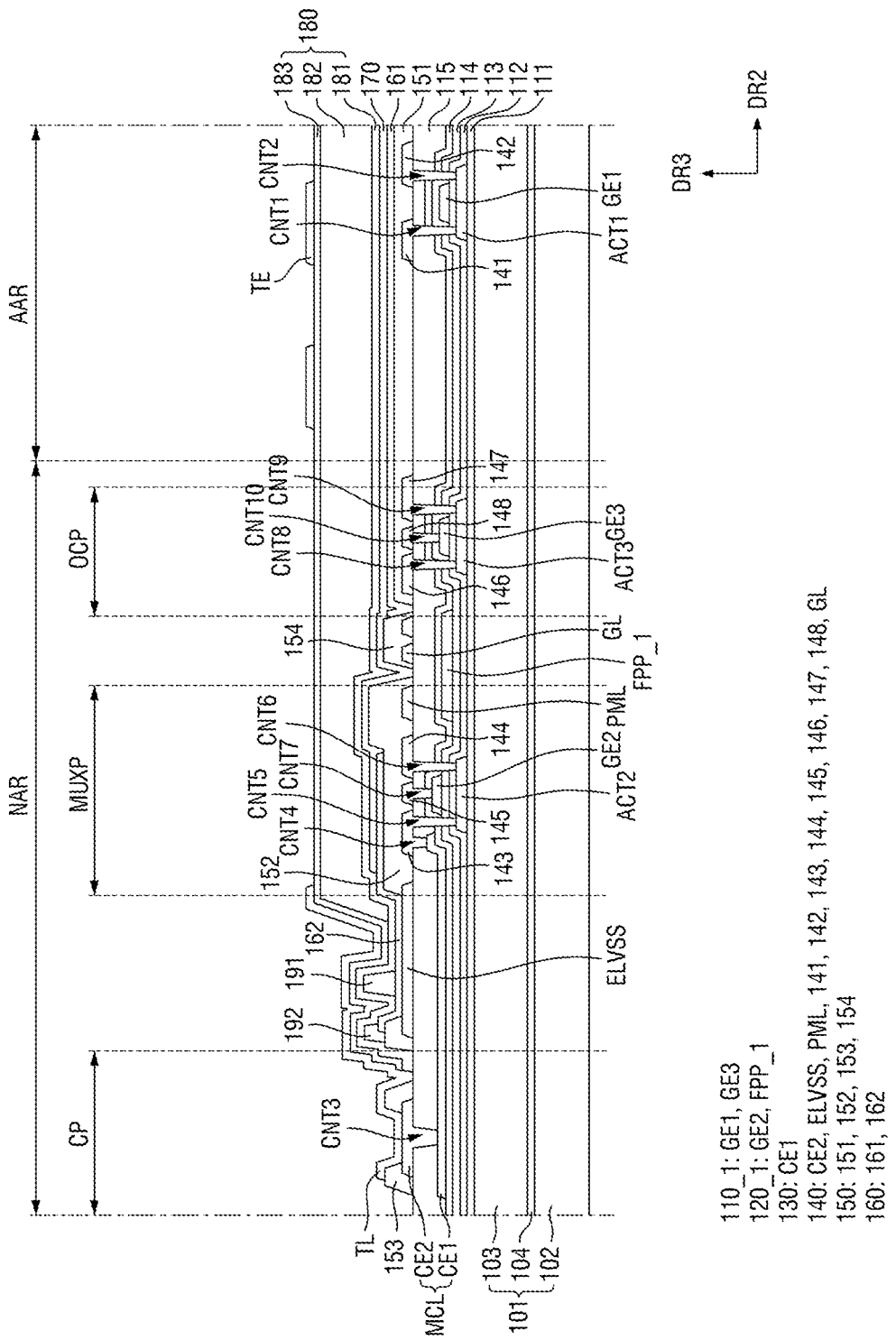
FIG. 15 is a cross-sectional view of a display panel according to some example embodiments.

FIG. 15 is a cross-sectional view of a display panel according to another embodiment.

Referring to FIG. 15, a transverse electric field blocking pattern FFP_1 according to the present embodiment is different from the aforementioned transverse electric field blocking pattern FFP according to an embodiment in that the transverse electric field blocking pattern FFP_1 is located on a second conductive layer 120_1.

For example, the transverse electric field blocking pattern FFP_1 according to the present embodiment may be located on the second conductive layer 120_1. In other words, the second conductive layer 120_1 may further include a transverse electric field blocking pattern FFP_1. The first conductive layer 1101 may include a first gate electrode GE1 and a third gate electrode GE3.

Figure 16:
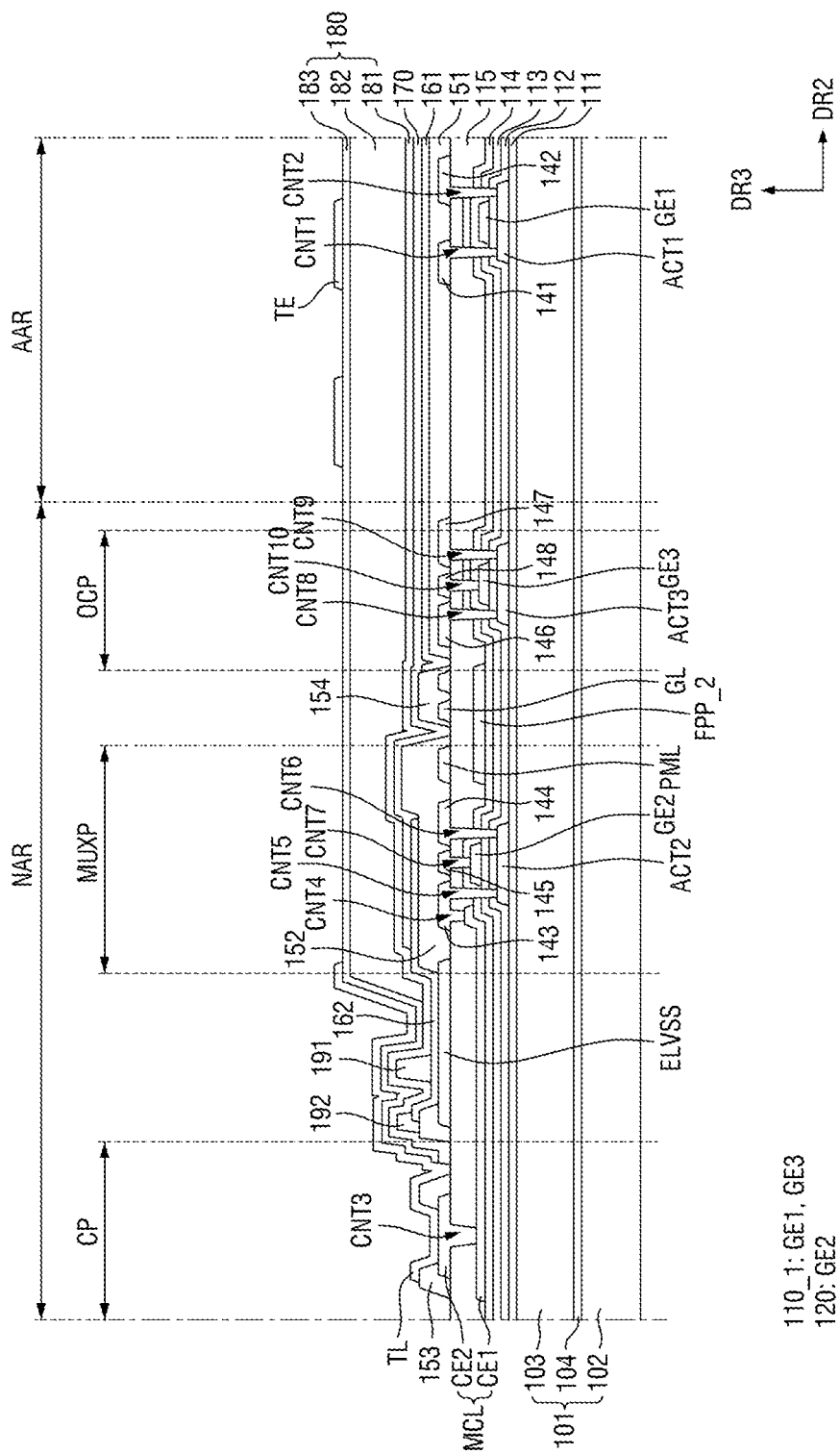
FIG. 16 is a cross-sectional view of a display panel according to some example embodiments.

FIG. 16 is a cross-sectional view of a display panel according to another embodiment.

Referring to FIG. 16, a transverse electric field blocking pattern FFP_2 according to the present embodiment is different from the aforementioned transverse electric field blocking pattern FFP according to an embodiment in that the transverse electric field blocking pattern FFP_2 is located on a third conductive layer 130_1.

For example, the transverse electric field blocking pattern FFP_2 according to the present embodiment may be located on the third conductive layer 130_1. In other words, the third conductive layer 130_1 may further include a transverse electric field blocking pattern FFP_1. The first conductive layer 110_1 may include a first gate electrode GE1 and a third gate electrode GE3.

Figure 17:
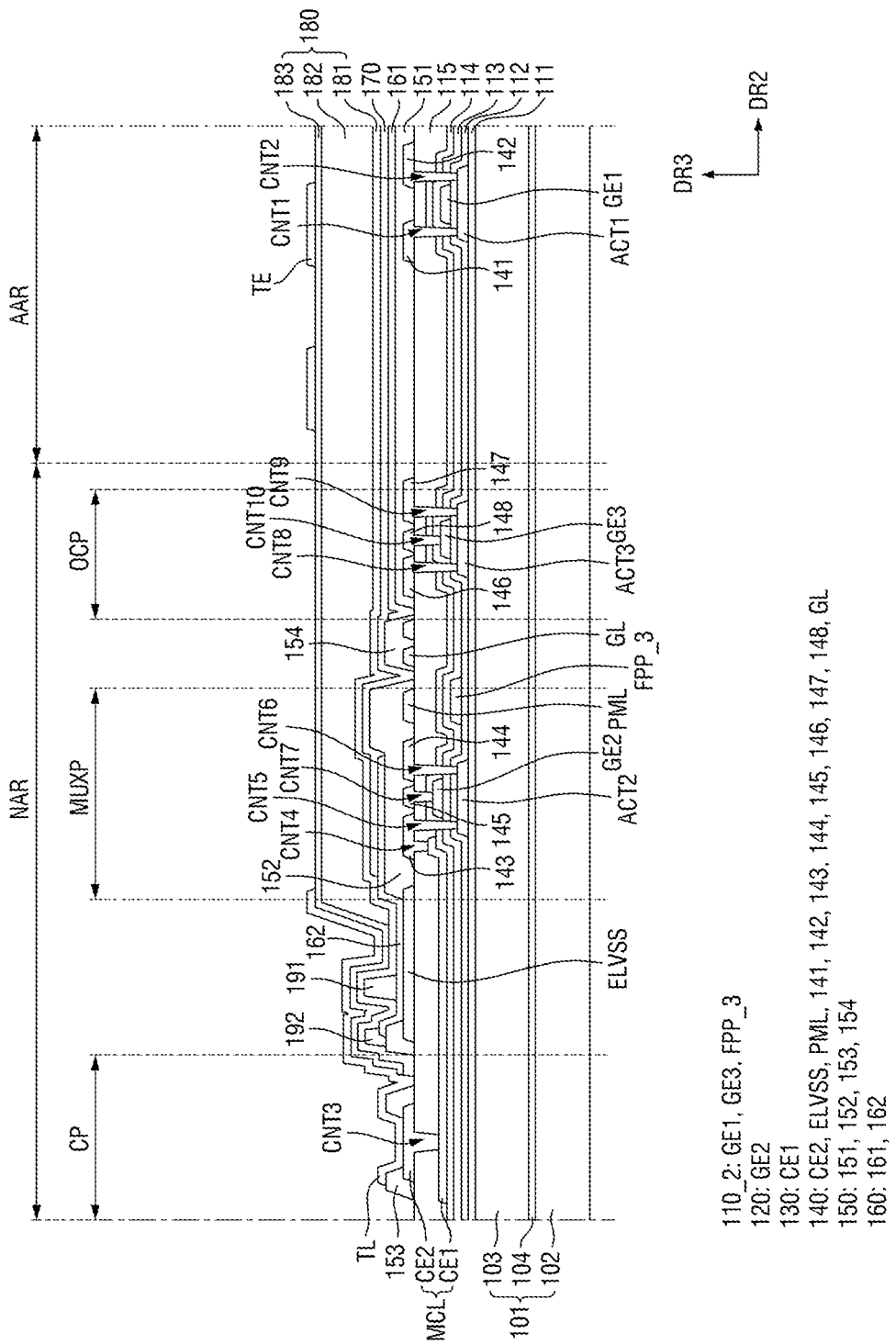
FIG. 17 is a cross-sectional view of a display panel according to some example embodiments.

FIG. 17 is a cross-sectional view of a display panel according to another embodiment.

Referring to FIG. 17, a transverse electric field blocking pattern FFP_3 according to the present embodiment is different from the aforementioned transverse electric field blocking pattern FFP according to an embodiment in that the transverse electric field blocking pattern FFP_3 does not overlap the ground line GL in the thickness direction.

For example, the transverse electric field blocking pattern FFP_3 according to the present embodiment may not overlap the ground line GL in the thickness direction.

Figure 18:
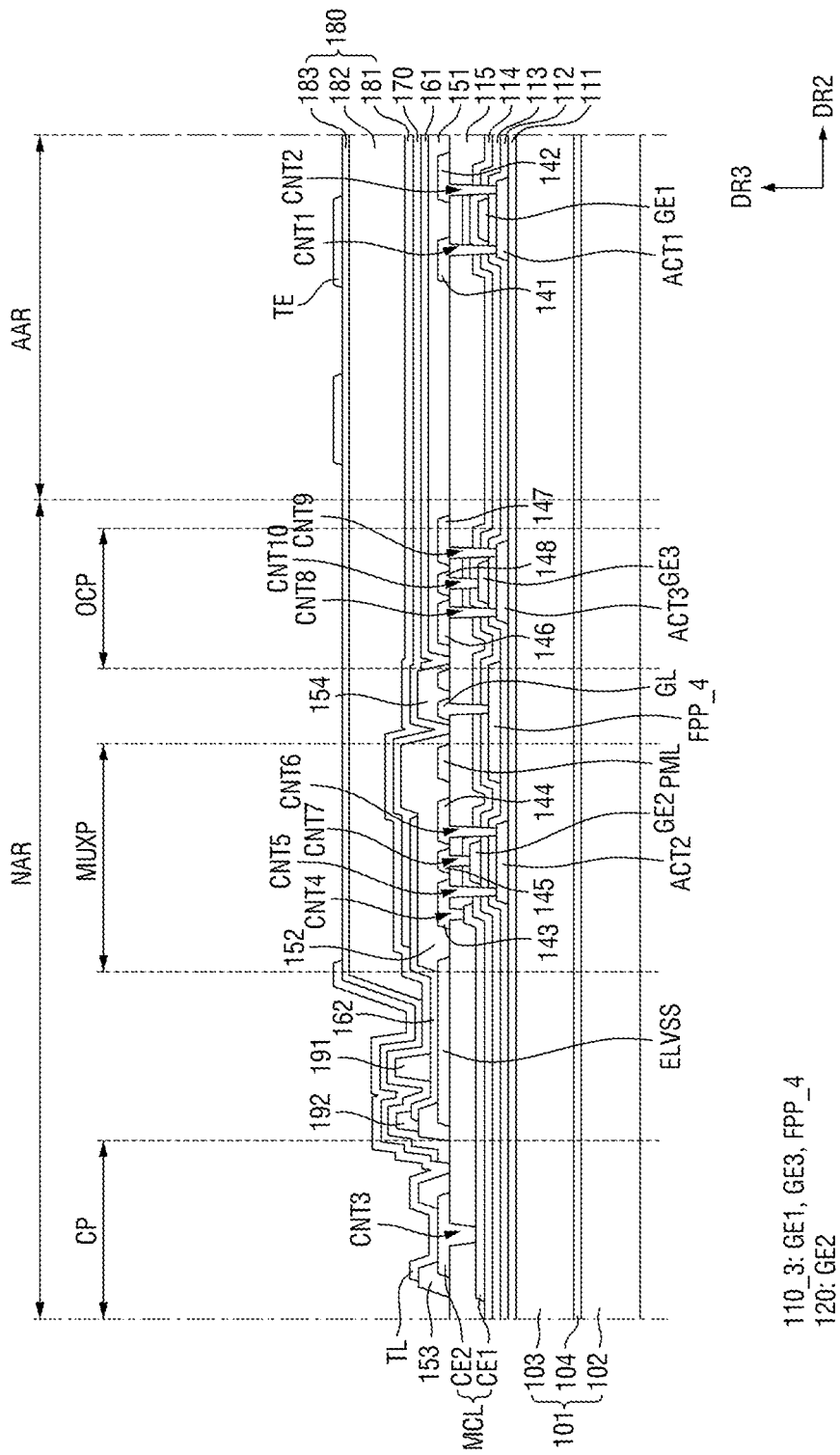
FIG. 18 is a cross-sectional view of a display panel according to some example embodiments.

FIG. 18 is a cross-sectional view of a display panel according to another embodiment.

Referring to FIG. 18, a transverse electric field blocking pattern FFP_4 according to the present embodiment is different from the embodiment of FIG. 11 in that the transverse electric field blocking pattern FFP_4 is electrically connected to the ground line GL.

For example, the transverse electric field blocking pattern FFP_4 according to the present embodiment may be electrically connected to the ground line GL. The transverse electric field blocking pattern FFP_4 may be electrically connected to the ground line GL through a contact hole penetrating through the ground line GL, the second interlayer insulating film 115, the first interlayer insulating film 114, and the second gate insulating layer 113.

Because the transverse electric field blocking pattern FFP_4 is electrically connected to the ground line GL, a ground voltage applied from the grounding pad GPAD may be equally applied to the lateral electric field blocking pattern FFP_4. That is, the ground voltage may be applied to the transverse electric field blocking pattern FFP_4. Although embodiments according to the present invention are not limited thereto, the ground voltage may be substantially about 0 V. Thus, the transverse electric field blocking pattern line FPPL and the transverse electric field blocking pattern pad FPPAD connected to the lateral electric field blocking pattern FFP may be omitted.

Accordingly, the first conductive layer 110_3 may include a first gate electrode GE1, a third gate electrode GE3, and the aforementioned transverse electric field blocking pattern FFP_4.

Figure 19:
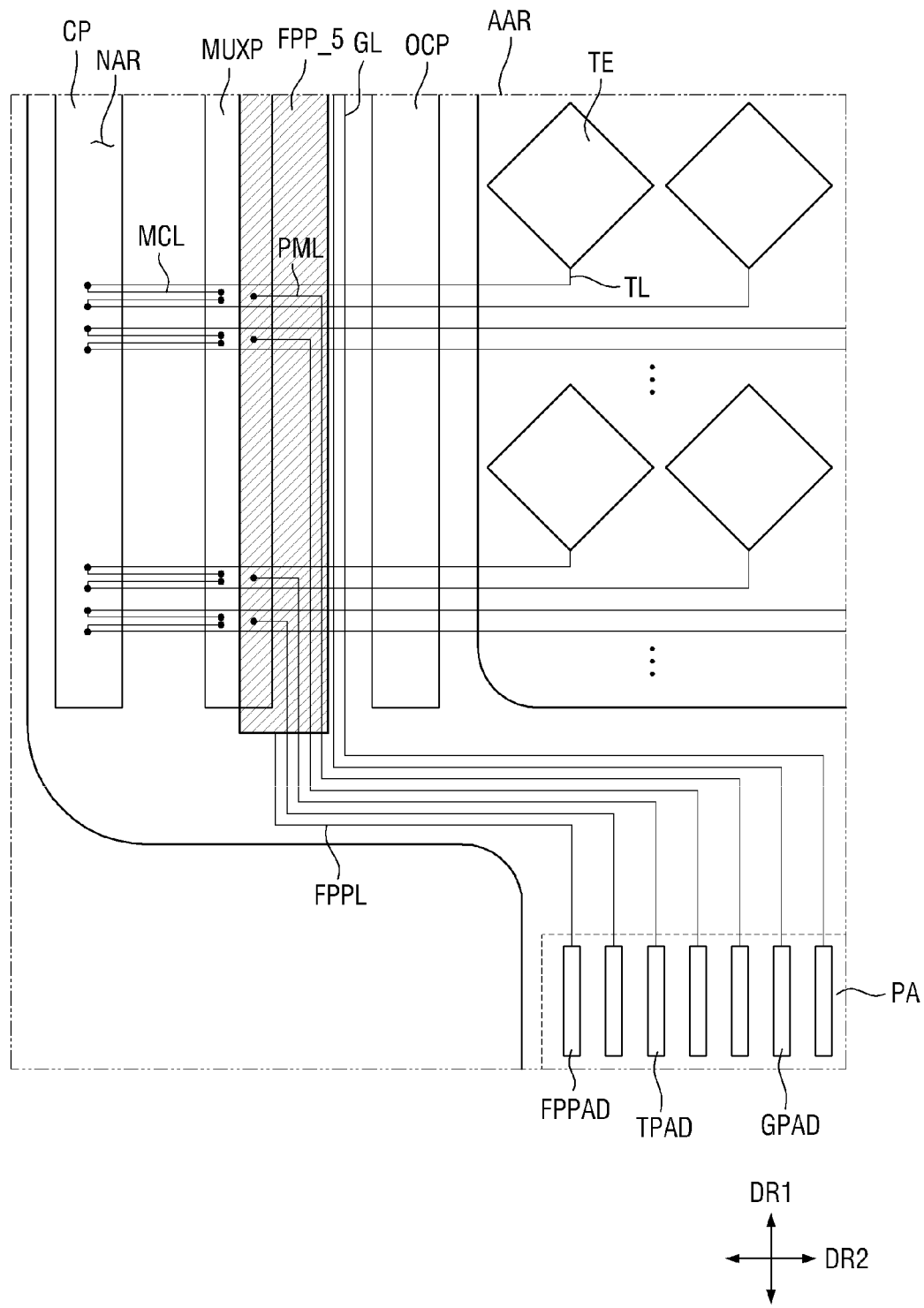
FIG. 19 is a schematic plan layout view of a display panel according to some example embodiments.

FIG. 19 is a schematic plan layout view of a display panel according to another embodiment.

Referring to FIG. 19, a display panel according to the present embodiment is different from the embodiment of FIG. 5 in that a transverse field blocking pattern FFP is formed as a floating electrode.

For example, in the display panel according to the present embodiment, a transverse field blocking pattern FFP is formed as a floating electrode. That is, the display panel according to the present embodiment is different from the embodiment of FIG. 5 in that the transverse electric field blocking pattern line FPPL connected to the transverse electric field blocking pattern FFP and the transverse electric field blocking pattern pad FPPAD are omitted.

Figure 20:
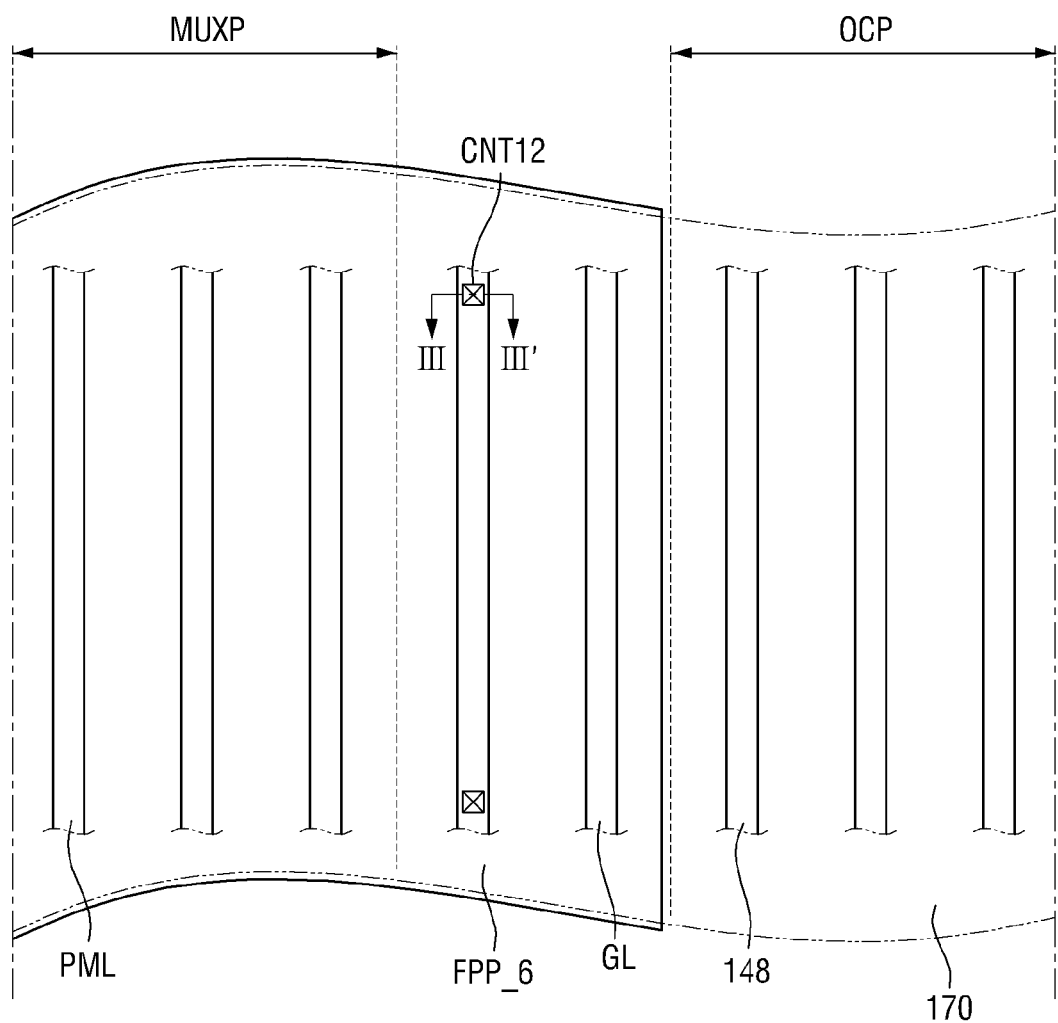
FIG. 20 is a plan layout view illustrating the arrangement relationship between a pad multiplexer connection line and an input signal line of an external driving circuit according to some example embodiments.
Figure 21:
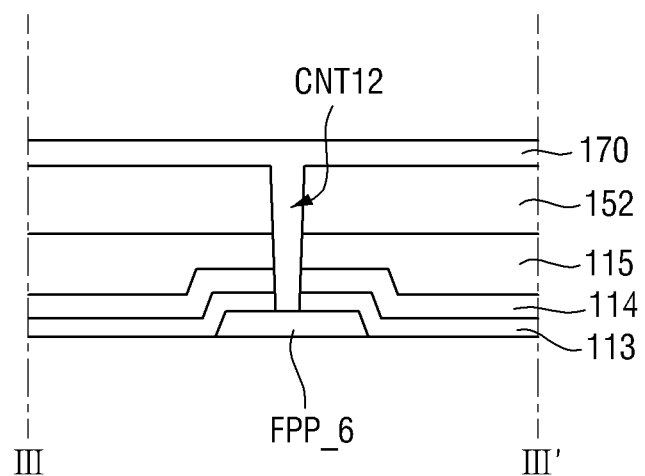
FIG. 21 is a cross-sectional view taken along the line III-III' of FIG. 20.

FIG. 20 is a plan layout view illustrating the arrangement relationship between a pad multiplexer connection line and an input signal line of an external driving circuit according to some example embodiments, and FIG. 21 is a cross-sectional view taken along the line III-III' of FIG. 20.

Referring to FIGS. 20 and 21, a transverse electric field blocking pattern FFP_6 according to the present embodiment is different from the embodiment of FIG. 13 in that the transverse electric field blocking pattern FFP_6 is electrically connected to the cathode electrode 170 through a twelfth contact hole CNT12 penetrating through the second insulating pattern 152, the second interlayer insulating film 115, the first interlayer insulating film 114, and the second gate insulating layer 113.

For example, the transverse electric field blocking pattern FFP_6 may be electrically connected to the cathode electrode 170 through the twelfth contact hole CNT12 penetrating through the second insulating pattern 152, the second interlayer insulating film 115, the first interlayer insulating film 114, and the second gate insulating layer 113. According to some example embodiments, because the transverse electric field blocking pattern FFP_6 is electrically connected to the cathode electrode 170 and the cathode electrode 170 is electrically connected to the low voltage supply line ELVSS, the voltage provided from the low voltage supply line ELVSS may be applied to the transverse electric field blocking pattern FFP_6. Thus, as shown in FIG. 19, the transverse electric field blocking pattern line FPPL connected to the transverse electric field blocking pattern FFP and the transverse electric field blocking pattern pad FPPAD may be omitted.

The effects of the present invention are not limited by the foregoing, and other various effects are anticipated herein.

Although aspects of some example embodiments of the present invention have been disclosed for illustrative purposes, those skilled in the art will appreciate that various modifications, additions and substitutions are possible, without departing from the scope and spirit of the invention as disclosed in the accompanying claims and their equivalents.

What is claimed is:

1. A display device, comprising:
    a substrate including an active area and a non-active area around the active area and including a pad area in which a plurality of touch pads are arranged;
    a plurality of sensing electrodes in the active area of the substrate;
    a plurality of sensing signal lines connected to each of the sensing electrodes;
    a multiplexer connected to the plurality of sensing signal lines;
    a pad multiplexer connection line connecting the multiplexer and the touch pad; and
    a transverse electric field blocking pattern between the pad multiplexer connection line and the substrate,
    wherein the transverse electric field blocking pattern covers the pad multiplexer connection line.

2. The display device of claim 1,
    wherein each of the sensing signal lines is connected to each of the sensing electrodes in one to one correspondence.

3. The display device of claim 2, further comprising:
    a driving circuit adjacent to the pad multiplexer connection line,
    wherein the transverse electric field blocking pattern is configured to block a transverse electric field between the driving circuit and the pad multiplexer connection line.

4. The display device of claim 3, further comprising:
    a cathode electrode between the pad multiplexer connection line and the sensing electrode,
    wherein the cathode electrode covers the pad multiplexer connection line and the driving circuit.

5. The display device of claim 4,
    wherein the driving circuit includes a light emission control driving circuit or a scan driving circuit.

6. The display device of claim 4,
    wherein the driving circuit includes a thin film transistor, and
    the pad multiplexer connection line extends in parallel with input signal lines connected to a gate electrode of the thin film transistor of the driving circuit.

7. The display device of claim 6, further comprising:
    a ground line between the pad multiplexer connection line and the input signal line.

8. The display device of claim 7,
    wherein the transverse electric field blocking pattern is electrically connected to the ground line.

9. The display device of claim 4,
    wherein the multiplexer includes a thin film transistor, and the thin film transistor of the multiplexer includes a drain electrode connected to the sensing signal line, a source electrode connected to the pad multiplexer connection line, and a gate electrode under the drain electrode and the source electrode.

10. The display device of claim 9,
wherein the sensing signal line is electrically connected to a source connection electrode under the sensing signal line, and
the source connection electrode is electrically connected to the drain electrode.

11. The display device of claim 10,
wherein the source connection electrode is electrically connected to a gate connection electrode under the source connection electrode, and
the gate connection electrode is electrically connected to the drain electrode.

12. The display device of claim 9,
wherein the gate electrode is electrically connected to a selection signal line of the multiplexer.

13. The display device of claim 9, further comprising:
a driving substrate attached onto the pad area,
wherein the driving substrate is configured to apply an input signal to the sensing electrode and apply an output signal outputted from the sensing electrode.

14. The display device of claim 13, further comprising:
a transverse electric field blocking pattern pad electrically connected to the transverse electric field blocking pattern in the pad area,
wherein a voltage is applied to the transverse electric field blocking pattern through the transverse electric field blocking pattern pad.

15. The display device of claim 14,
wherein the voltage applied to the transverse electric field blocking pattern is equal to a voltage of the input signal and/or a voltage of the output signal.

16. The display device of claim 4,
wherein the cathode electrode overlaps the transverse electric field blocking pattern and is electrically connected to the transverse electric field blocking pattern.

17. A display device, comprising:
a substrate including an active area and a non-active area around the active area and including a pad area in which a plurality of touch pads are arranged;
a plurality of light emitting elements arranged in the active area of the substrate;
an encapsulation layer on the plurality of light emitting elements and over the active area and the non-active area;
a touch sensor on the encapsulation layer, in which the touch sensor includes a plurality of sensing electrodes arranged on the active area of the encapsulation layer and a plurality of sensing signal lines connected to each of the sensing electrodes;
a plurality of sensing signal lines connected to each of the sensing electrodes;
a multiplexer connected to the plurality of sensing signal lines;
a pad multiplexer connection line connecting the multiplexer and the touch pad; and
a transverse electric field blocking pattern between the pad multiplexer connection line and the substrate,
wherein the transverse electric field blocking pattern covers the pad multiplexer connection line.

18. The display device of claim 17,
wherein each of the sensing signal lines is connected to each of the sensing electrodes in one to one correspondence.

19. The display device of claim 18, further comprising:
a driving circuit adjacent to the pad multiplexer connection line,
wherein the transverse electric field blocking pattern is configured to block a transverse electric field between the driving circuit and the pad multiplexer connection line.

20. The display device of claim 19, further comprising:
a cathode electrode between the pad multiplexer connection line and the sensing electrode,
wherein the cathode electrode covers the pad multiplexer connection line and the driving circuit, and
the driving circuit includes a light emission control driving circuit or a scan driving circuit.

* * * * *